United States Patent
Okada

(10) Patent No.: US 7,360,455 B2
(45) Date of Patent: Apr. 22, 2008

(54) FORCE DETECTOR AND ACCELERATION DETECTOR AND METHOD OF MANUFACTURING THE SAME

(76) Inventor: Kazuhiro Okada, 73, Sugaya 4-Chome, Ageo-shi, Saitama 362 (JP)

( * ) Notice: Subject to any disclaimer, the term of this patent is extended or adjusted under 35 U.S.C. 154(b) by 0 days.

(21) Appl. No.: 11/724,037

(22) Filed: Mar. 14, 2007

(65) Prior Publication Data
US 2007/0204692 A1 Sep. 6, 2007

Related U.S. Application Data

(60) Continuation of application No. 11/521,218, filed on Sep. 14, 2006, now abandoned, which is a division of application No. 10/889,549, filed on Jul. 12, 2004, now Pat. No. 7,152,485, which is a division of application No. 10/247,772, filed on Sep. 19, 2002, now Pat. No. 6,779,408, which is a division of application No. 09/907,444, filed on Jul. 17, 2001, now Pat. No. 6,477,903, which is a division of application No. 09/614,850, filed on Jul. 12, 2000, now Pat. No. 6,314,823, which is a division of application No. 09/375,334, filed on Aug. 16, 1999, now Pat. No. 6,158,291, which is a division of application No. 09/109,560, filed on Jul. 2, 1998, now Pat. No. 6,053,057, which is a division of application No. 08/819,357, filed on Mar. 18, 1997, now Pat. No. 5,811,693, which is a division of application No. 08/647,178, filed on May 9, 1996, now Pat. No. 5,639,973, which is a division of application No. 08/394,310, filed on Feb. 24, 1995, now Pat. No. 5,531,002, which is a division of application No. 08/292,496, filed on Aug. 18, 1994, now Pat. No. 5,406,848, which is a division of application No. 07/764,159, filed on Sep. 20, 1991, now Pat. No. 5,421,213.

(30) Foreign Application Priority Data

Oct. 12, 1990 (JP) .................................. 2-274299
Dec. 31, 1990 (JP) .................................. 2-416188

(51) Int. Cl.
*G01D 7/00* (2006.01)
(52) U.S. Cl. ................................. 73/862.043
(58) Field of Classification Search ............. 73/517, 73/862.041–862.043, 780; 324/678
See application file for complete search history.

(56) References Cited

U.S. PATENT DOCUMENTS
3,270,260 A 8/1966 Mehr .................... 317/255
(Continued)

FOREIGN PATENT DOCUMENTS
DE 2758986 7/1978
(Continued)

OTHER PUBLICATIONS
Patent Abstracts of Japan, vol. 014, No. 366 (P-1089) Aug. 1990.
(Continued)

*Primary Examiner*—Jewel Thompson
(74) *Attorney, Agent, or Firm*—Ladas and Parry LLP

(57) ABSTRACT

An electrode layer is formed on the upper surface of a first substrate, and a processing for partially removing the substrate is carried out in order to allow the substrate to have flexibility. To the lower surface of the first substrate, a second substrate is connected. Then, by cutting the second substrate, a working body and a pedestal are formed. On the other hand, a groove is formed on a third substrate. An electrode layer is formed on the bottom surface of the groove. The third substrate is connected to the first substrate so that both the electrodes face to each other with a predetermined spacing therebetween. Finally, the first, second and third substrates are cut off every respective unit regions to form independent sensors, respectively. When an acceleration is exerted on the working body, the first substrate bends. As a result, the distance between both the electrodes changes. Thus, an acceleration exerted is detected by changes in an electrostatic capacitance between both the electrodes.

15 Claims, 22 Drawing Sheets

U.S. PATENT DOCUMENTS

| | | | |
|---|---|---|---|
| 3,509,583 A | 5/1970 | Fraioli | 623/24 |
| 3,952,234 A | 4/1976 | Birchall | 73/724 |
| 4,175,428 A | 11/1979 | Eilersen | 73/862.626 |
| 4,261,086 A | 4/1981 | Giachino et al. | 29/25.41 |
| 4,372,162 A | 2/1983 | Shutt | |
| 4,373,399 A | 2/1983 | Beloglazov et al. | 73/777 |
| 4,384,899 A | 5/1983 | Myers | 29/25.41 |
| 4,454,771 A | 6/1984 | Shimazoe et al. | 73/862.68 |
| 4,542,436 A | 9/1985 | Carusillo | 73/718 |
| 4,552,028 A | 11/1985 | Burckhardt et al. | 73/862.041 |
| 4,571,661 A | 2/1986 | Hoshino | |
| 4,586,109 A | 4/1986 | Peters et al. | 29/25.41 |
| 4,615,105 A | 10/1986 | Wada et al. | 29/594 |
| 4,663,972 A | 5/1987 | Gerard | |
| 4,680,606 A | 7/1987 | Knutti et al. | 73/862.041 |
| 4,711,128 A | 12/1987 | Boura | |
| 4,719,538 A | 1/1988 | Cox | 361/283.2 |
| 4,853,894 A | 8/1989 | Yamanaka et al. | 365/154 |
| 4,855,866 A | 8/1989 | Imamura et al. | 361/306 |
| 4,864,463 A | 9/1989 | Shkedi | 361/283.4 |
| 4,891,985 A | 1/1990 | Glenn | 73/517.12 |
| 4,905,523 A | 3/1990 | Okada | 73/862.04 |
| 4,910,840 A | 3/1990 | Sprenkels et al. | 29/594 |
| 4,941,354 A | 7/1990 | Russell et al. | |
| 4,967,605 A | 11/1990 | Okada | 73/862.04 |
| 4,969,366 A | 11/1990 | Okada | 73/862.08 |
| 5,014,415 A | 5/1991 | Okada | 29/621.1 |
| 5,035,148 A | 7/1991 | Okada | 73/862.04 |
| 5,054,323 A | 10/1991 | Hubbard, Jr. et al. | 73/DIG. 4 |
| 5,092,645 A | 3/1992 | Okada | 294/86.4 |
| 5,095,752 A | 3/1992 | Suzuki et al. | |
| 5,122,755 A | 6/1992 | Nootbaar et al. | |
| 5,182,515 A | 1/1993 | Okada | 324/259 |
| 5,263,375 A | 11/1993 | Okada | 73/862.042 |
| 5,295,386 A | 3/1994 | Okada | 73/1 D |
| 5,317,922 A | 6/1994 | Bomback et al. | 361/283.3 |
| 5,343,765 A | 9/1994 | Okada | 73/862.043 |
| 5,365,799 A | 11/1994 | Okada | 73/862.041 |
| 5,392,651 A | 2/1995 | Suzuki et al. | |
| 5,392,658 A | 2/1995 | Okada | 73/862.043 |
| 5,406,848 A | 4/1995 | Okada | 73/517 R |
| 5,421,213 A | 6/1995 | Okada | 73/862.043 |
| 5,437,196 A | 8/1995 | Okada | 73/862.043 |
| 5,492,020 A | 2/1996 | Okada | 73/862.626 |
| 5,497,668 A | 3/1996 | Okada | 73/862.626 |
| 5,531,002 A | 7/1996 | Okada | 29/25.41 |
| 5,531,092 A | 7/1996 | Okada | 73/1 D |
| 5,559,290 A | 9/1996 | Suzuki et al. | |
| 5,571,972 A | 11/1996 | Okada | 73/862.043 |
| 5,639,973 A | 6/1997 | Okada | 73/862.043 |
| 5,646,346 A | 7/1997 | Okada | 73/504.04 |
| 5,661,235 A | 8/1997 | Bonin | 73/862.626 X |
| 5,668,318 A | 9/1997 | Okada | 73/504.11 |
| 5,682,000 A | 10/1997 | Okada | 73/862.043 |
| 5,744,718 A | 4/1998 | Okada | 73/514.33 |
| 5,780,749 A | 7/1998 | Okada | 73/862.043 |
| 5,786,997 A | 7/1998 | Hoyt et al. | 73/862.043 X |
| 5,811,693 A | 9/1998 | Okada | 73/862.043 |
| 5,831,163 A | 11/1998 | Okada | 73/504.12 |
| 5,850,040 A | 12/1998 | Okada | 73/504.04 |
| 5,856,620 A | 1/1999 | Okada | 73/514.32 |
| 5,962,787 A | 10/1999 | Okada et al. | 73/514.32 |
| 5,987,985 A | 11/1999 | Okada | 73/504.04 |
| 6,003,371 A | 12/1999 | Okada | 73/504.02 |
| 6,053,057 A | 4/2000 | Okada | 73/862.043 |
| 6,076,401 A | 6/2000 | Okada | 73/504.12 |
| 6,098,461 A | 8/2000 | Okada | 73/514.34 |
| 6,158,291 A | 12/2000 | Okada | 73/862.043 |
| 6,159,761 A | 12/2000 | Okada | 438/53 |
| 6,185,814 B1 | 2/2001 | Okada | 29/621.1 |
| 6,205,856 B1 | 3/2001 | Okada | 73/504.11 |
| 6,269,697 B1 | 8/2001 | Okada | 73/504.02 |
| 6,282,956 B1 | 9/2001 | Okada | 73/504.12 |
| 6,314,823 B1 | 11/2001 | Okada | 73/862.43 |
| 6,367,326 B1 | 4/2002 | Okada | 73/504.12 |
| 6,378,381 B1 | 4/2002 | Okada et al. | 73/862.043 |
| 6,474,133 B1 | 11/2002 | Okada | 73/1.38 |
| 6,477,903 B2 | 11/2002 | Okada | 73/862.043 |
| 6,512,364 B1 | 1/2003 | Okada | 324/158.1 |
| 6,530,283 B2 | 3/2003 | Okada et al. | 73/780 |
| 6,716,253 B2 | 4/2004 | Okada | 73/52 |
| 6,772,632 B2 | 8/2004 | Okada | 73/514.38 |
| 6,779,408 B2 | 8/2004 | Okada et al. | 324/681 |
| 6,809,529 B2 | 10/2004 | Okada | |
| 6,859,048 B2 | 2/2005 | Okada | |
| 6,864,677 B1 | 3/2005 | Okada | |
| 6,865,943 B2 | 3/2005 | Okada | |
| 6,894,482 B2 | 5/2005 | Okada | |
| 6,915,709 B2 | 7/2005 | Okada | |
| 6,920,788 B2 | 7/2005 | Okada | |
| 6,990,867 B2 | 1/2006 | Okada | |
| 7,059,188 B2 | 6/2006 | Okada | |
| 7,075,527 B2 | 7/2006 | Okada et al. | |
| 7,121,147 B2 | 10/2006 | Okada | |
| 7,123,028 B2 | 10/2006 | Okada et al. | |
| 7,152,485 B2 * | 12/2006 | Okada | 73/780 |

FOREIGN PATENT DOCUMENTS

| | | |
|---|---|---|
| DE | 3008441 | 9/1981 |
| DE | 3226386 | 1/1984 |
| EP | 0133997 | 3/1985 |
| EP | 0312605 | 4/1989 |
| EP | 0316498 | 5/1989 |
| EP | 0338766 | 10/1989 |
| EP | 0369352 | 5/1990 |
| EP | 0401635 | 12/1990 |
| FR | 2265135 | 3/1974 |
| GB | 2107472 | 4/1983 |
| GB | 2186085 | 8/1987 |
| GB | 2226699 | 7/1990 |
| JP | 57190241 | 11/1982 |
| JP | 59-44875 | 3/1984 |
| JP | 59155734 | 4/1984 |
| JP | 0166829 | 9/1984 |
| JP | 60-55655 | 3/1985 |
| JP | 60207066 | 3/1985 |
| JP | 6056275 | 4/1985 |
| JP | 0147622 | 8/1985 |
| JP | 60161539 | 8/1985 |
| JP | 60190828 | 9/1985 |
| JP | 6184711 | 9/1986 |
| JP | 62011257 | 1/1987 |
| JP | 62123361 | 6/1987 |
| JP | 62-207917 | 9/1987 |
| JP | 63108763 | 5/1988 |
| JP | 86508 | 3/1989 |
| JP | 01150383 | 6/1989 |
| JP | 1-259265 | 10/1989 |
| JP | 1263576 | 10/1989 |
| JP | 80930 | 3/1990 |
| JP | 2-134570 | 5/1990 |
| JP | 0218932 | 8/1990 |
| JP | 3050809 | 3/1991 |
| JP | 3165552 | 7/1991 |
| WO | 8909927 | 10/1989 |
| WO | 9501081 | 1/1995 |
| WO | 9601926 | 1/1996 |

OTHER PUBLICATIONS

Patent Abstracts of Japan, vol. 013, No. 266 (P-887) Jun. 20, 1989.
Patent Abstracts of Japan, vol. 012, No. 351 (E-660), Sep. 20, 1988, for JP 63108763A.

Patent Abstracts of Japan, vol. 013, No. 410(E-819), Sep. 11, 1989, for JP 01150383A.
Patent Abstracts of Japan, vol. 011, No. 179 (E-514), Jun. 9, 1987, for JP 62011257A.
Patent Abstracts of Japan, vol. 010, No. 177 (p. 470) Jun. 21, 1986.
Patent Abstracts of Japan, vol. 015, No. 311 (E-1098) Aug. 1991.
"Technical Trend Sensor Static Capacitance Type of Acceleration Sensor made for Silicon . . . " Translation of *Nikkei Mechanical* (1988) p. 88.
Patent Abstracts of Japan, vol. 10, No. 45, Feb. 21, 1986, p. 430.
Patent Abstracts of Japan, vol. 7, No. 38, Feb. 16, 1983, p. 176.
Patent Abstracts of Japan, vol. 10, No. 256, Sep. 2, 1986, p. 493.
Wolffenbuttel, R. F., et al. "Multiaxis Compliant Capacitive Wrist Sensor For Use In Automated Assembly With Industrial Robots". *IEEE Instrumentation and Measurement Technology Conference*, 1990, pp. 54-59.
Patent Abstracts of Japan of JP 2134570 of May 1990.
Patent Abstracts of Japan of JP 1059132 of Mar. 1989.
Patent Abstracts of Japan of JP 59166829 of Sep. 1984.
Patent Abstracts of Japan of JP 61026834 of Feb. 1986.
Patent Abstracts of Japan of JP 3112170 of May 1991.

Partial English Trans. of p. 2 of Japanese PatentOffice Action of 12-9/26 (App No. 10-210320) for JP 1263576 dated Oct. 1989.
Partial English Trans. of Japanese Patent Office Action of 11-5/18 (Appln. No. 9-072692) for JP 60-56275 dated Apr. 1985.
Patent Abstracts of Japan of JP 3050809 dated May 16, 1991 vol. 15 No. 101.
Patent Abstracts of Japan of JP 3165552 dated Oct. 16, 1991 vol. 15, No. 40.
Patent Abstracts of Japan, vol. 11, No. 58, Feb. 21, 1987, p. 550.
Patent Abstracts of Japan, vol. 9, No. 6, Jan. 11, 1985.
N.T.I.S. Technical Notes, "Force Sensor . . . ", Part F, Feb. 1986, p. 188.
Peterson, K., Transducers '85, International Conference on Solid-State Sensors an Actuators, "A force sensing chip . . . ", 1985, pp. 30-32.
Suzuki, M. et al., Proceedings.
IECOH '86, International Conference on Industrial Electronics, Control and Instrumentation, "Three Kinds of Dexterous . . . ", Milwaukee, Wis., pp. 544-548.

* cited by examiner

|    | Fx | -Fx | Fy | -Fy | Fz | -Fz |
|----|----|-----|----|-----|----|-----|
| C1 | −  | +   | 0  | 0   | +  | −   |
| C2 | 0  | 0   | +  | −   | +  | −   |
| C3 | +  | −   | 0  | 0   | +  | −   |
| C4 | 0  | 0   | −  | +   | +  | −   |

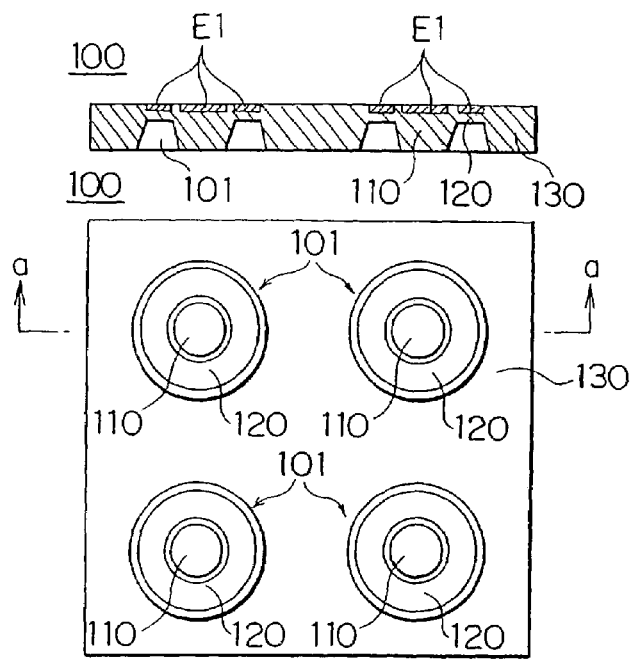
FIG. 28a
FIG. 28b
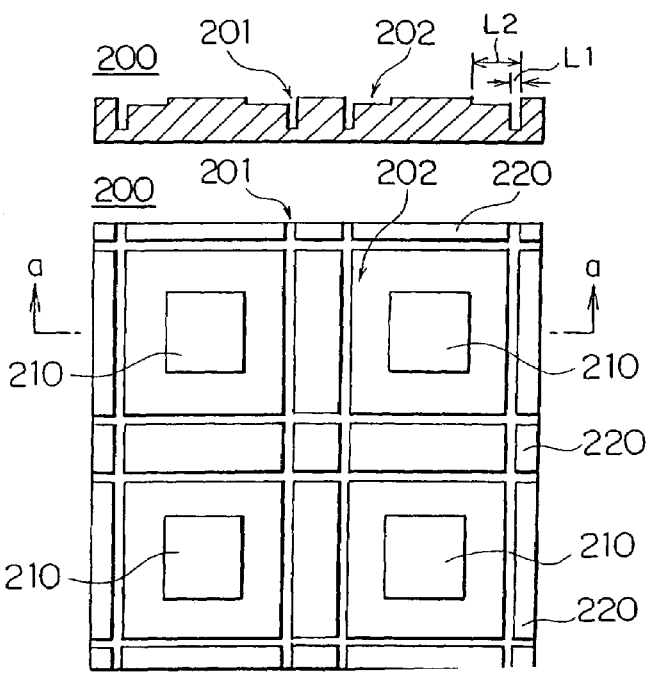
FIG. 29a
FIG. 29b

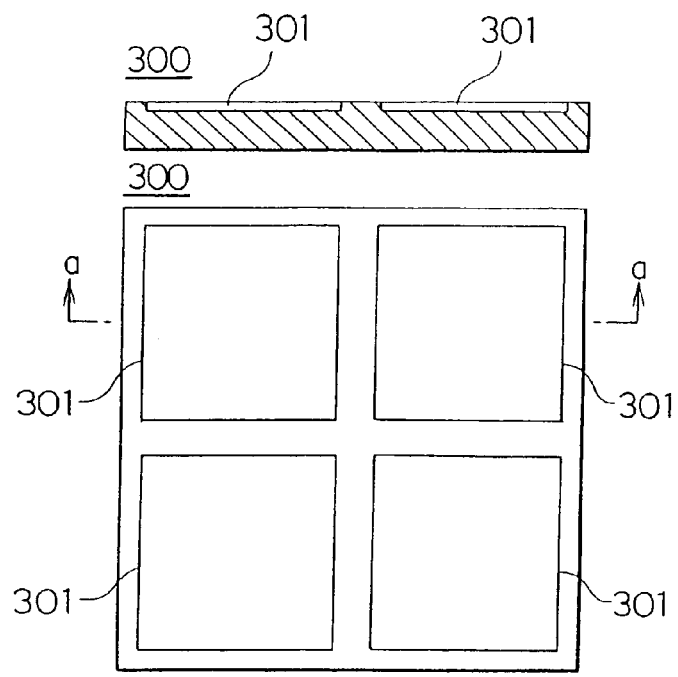
FIG. 30a
FIG. 30b
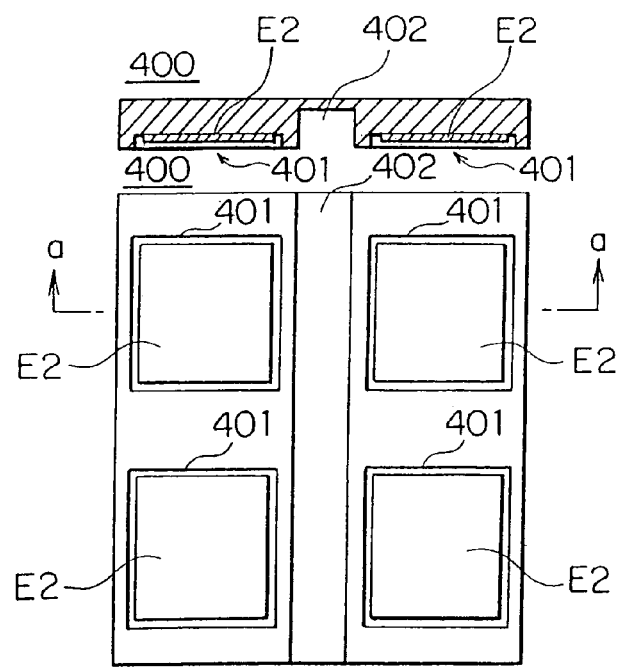
FIG. 31a
FIG. 31b

F I G. 33
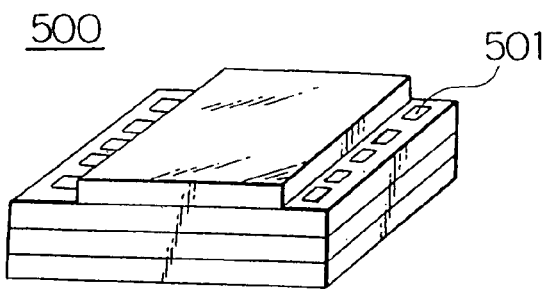
F I G. 34
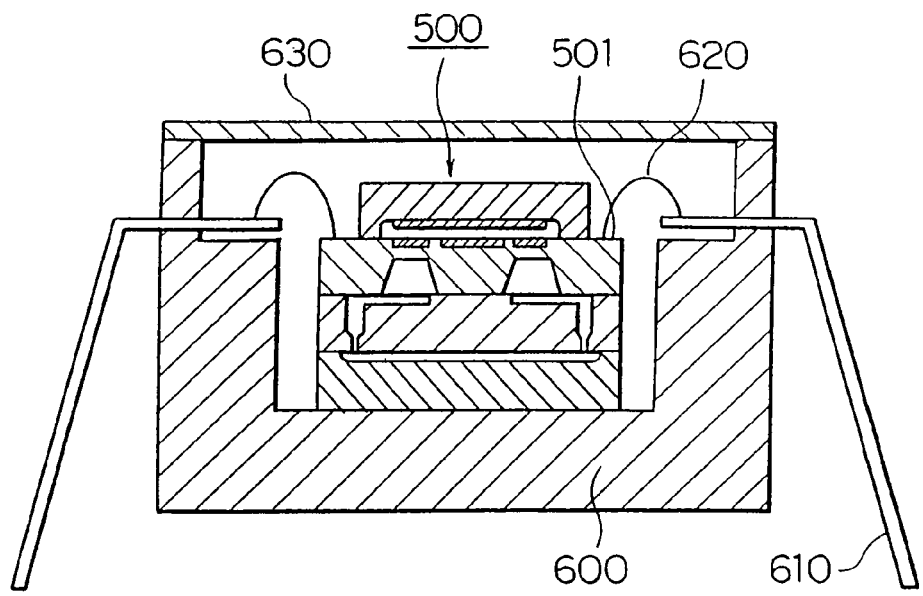
F I G. 35
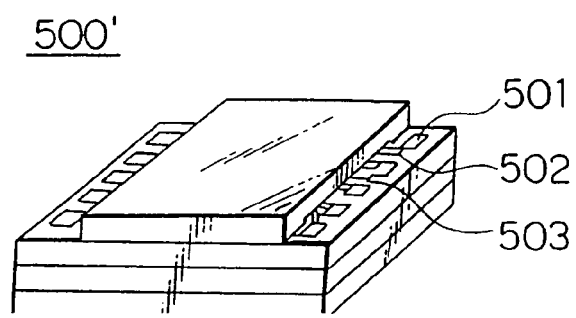

FIG. 36a
FIG. 36b
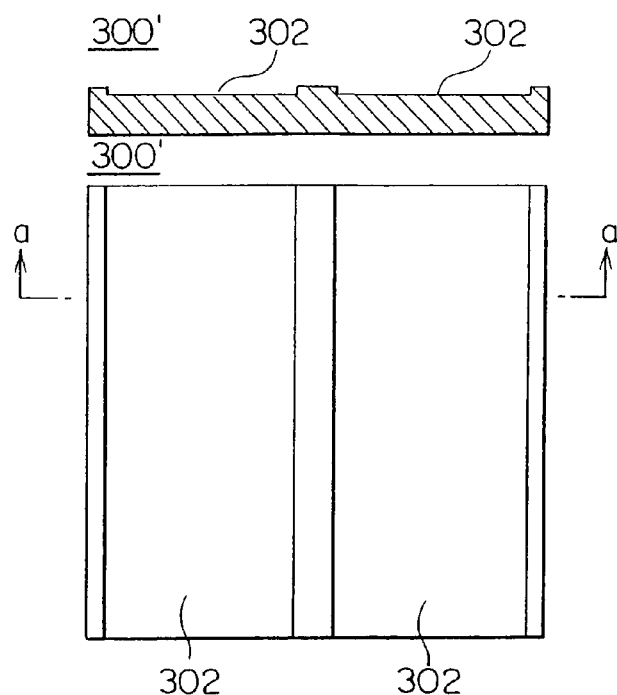
FIG. 37a
FIG. 37b
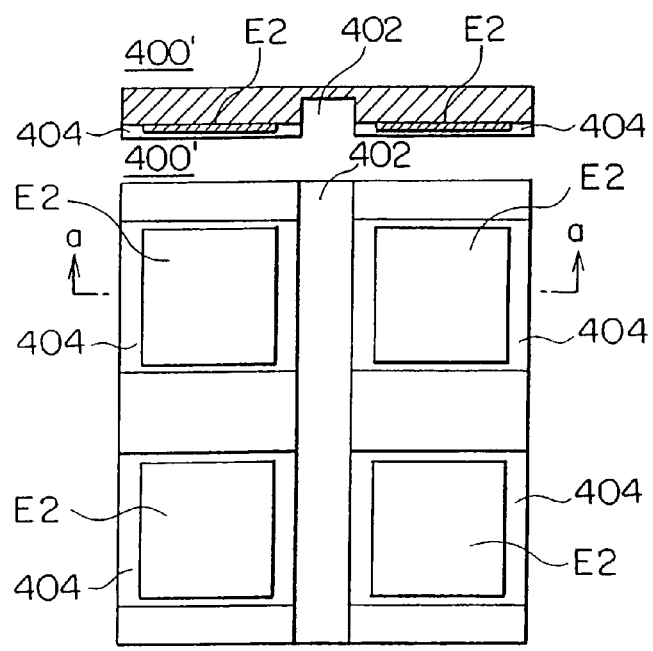

FORCE DETECTOR AND ACCELERATION DETECTOR AND METHOD OF MANUFACTURING THE SAME

This application is a continuation of application Ser. No. 11/521,218 filed on Sep. 14, 2006 now abandoned, which is a DIV of Ser. No. 10/889,549 filed on Jul. 12, 2004 now U.S. Pat. No. 7,152,485, which is a DIV of Ser. No. 10/247,772 filed Sep. 19, 2002 (U.S. Pat. No. 6,779,408) which is a DIV of Ser. No. 09/907,444 filed Jul. 17, 2001 (U.S. Pat. No. 6,477,903) which is a DIV of Ser. No. 09/614,850 filed Jul. 12, 2000 (U.S. Pat. No. 6,314,823) which is a DIV of Ser. No. 09/375,334 filed Aug. 16, 1999 (U.S. Pat. No. 6,158,291) which is a DIV of Ser. No. 09/109,560 filed Jul. 2, 1998 (U.S. Pat. No. 6,053,057) which is a DIV of Ser. No. 08/819,357 filed Mar. 18, 1997 (U.S. Pat. No. 5,811,693) which is a DIV of Ser. No. 08/647,178 filed May 9, 1996 (U.S. Pat. No. 5,639,973) which is a DIV of Ser. No. 08/394,310 filed Feb. 24, 1995 (U.S. Pat. No. 5,531,002) which is a DIV of Ser. No. 08/292,496 filed Aug. 18, 1994 (U.S. Pat. No. 5,406,848) which is a DIV of Ser. No. 07/764,159 filed Sep. 20, 1991 (U.S. Pat. No. 5,421,213) claims the benefit thereof and incorporates the same by reference.

BACKGROUND OF THE INVENTION

This invention relates to a force detector and an acceleration detector to which the force detector is applied, and more particularly to a detector suitable for detection of multidimensional force or acceleration components. Further, this invention provides a method suitable for mass producing such detectors.

In the automobile industry or the machinery industry, there has been increased demand for detectors capable of precisely detecting a physical quantity such as force, acceleration or magnetism. Particularly, it is required to realize small detectors capable of detecting physical quantities every respective two-dimensional or three-dimensional components.

To meet such a demand, there has been proposed a force detector in which gauge resistors are formed on a semiconductor substrate such as silicon, etc. to transform a mechanical distortion produced in the substrate on the basis of a force applied from the external to an electric signal by making use of the piezo resistive effect. When a weight body is attached to the detecting unit of the force detector, an acceleration detector for detecting, as a force, an acceleration applied to the weight body can be realized. Further, when a magnetic body is attached to the detecting unit of the force detector, a magnetic detector for detecting, as a force, a magnetism exerted on the magnetic body can be realized.

For example, in U.S. Pat. Nos. 4,905,523, 4,967,605, 4,969,366, U.S. patent application Ser. Nos. 07/362,399, 07/470,102, and 07/559,381, force detectors using gauge resistor, acceleration detectors, and magnetic detectors are disclosed. Further, in U.S. patent application Ser. No. 07/526,837, a manufacturing method suitable for these detectors is disclosed.

Since there generally exists temperature dependency in the gauge resistance or the piezo resistive coefficient, in the case of the above described detectors, if there occurs any change in the temperature of the environment where those detectors are used, a detected value would include an error. Accordingly, it is required for carrying out a precise measurement to conduct temperature compensation. Particularly, in the case where such detectors are used in the field of automotive vehicle, etc., temperature compensation is required over the considerably broad operating temperature range of −40 to +12° C.

In addition, in order to manufacture the above described detectors, a high level process for processing the semiconductor substrate is required, and a high cost apparatus such as an ion implanter is also required. For this reason, there is the problem that the manufacturing cost becomes high.

SUMMARY OF THE INVENTION

A first object of this invention is to provide a novel detector which can detect a physical quantity such as force, acceleration or magnetism, etc. without carrying out temperature compensation, and can be supplied at a low cost.

A second object of this invention is to provide a manufacturing method suitable for mass production of such a novel detector.

1. Feature Relating to the Detector

To attain the above described first object, the detector according to this invention is featured as follows:

(1) The first feature resides in a force detector comprising:

a flexible substrate including a fixed portion fixed to a detector casing, a working portion to which a force from the external is transmitted, and a flexible portion having flexibility formed between the fixed portion and the working portion, a fixed substrate fixed on the detector casing so as to face the flexible substrate, a working body adapted to receive a force from the external to transmit this force to the working portion of the flexible substrate, a displacement electrode formed on the surface facing to the fixed substrate of the flexible substrate, and a fixed electrode formed on the surface facing to the flexible substrate of the fixed substrate, wherein any one of the displacement electrode and the fixed electrode, or both the electrodes are constituted by a plurality of electrically independent localized electrodes to form a plurality of capacitance elements by electrodes opposite to each other to detect a force exerted on the working body every multidimensional respective components on the basis of changes in the electrostatic capacitance values of the respective capacitance elements.

In the force detector having the above mentioned first feature, when a force from the external is applied to the working body, the flexible substrate bends, so a distance between the displacement electrode and the fixed electrode varies. Accordingly, an electrostatic capacitance between both electrodes varies. Because the change of the electrostatic capacitance is dependent upon a force applied from the external, detection of force can be made by detecting the change of the electrostatic capacitance. In addition, at least one of the displacement electrode and the fixed electrode is constituted by a plurality of localized electrodes. A change of an electrostatic capacitance of a capacitance element formed by a localized electrode is dependent upon a direction of a force exerted and a position of the local electrode. Accordingly, changes in electrostatic capacitance values of a plurality of capacitance elements formed by a plurality of localized electrodes include information relating to a direction of the force exerted. Thus, the force exerted can be detected every multidimensional respective components.

(2) In the force detector having the above described first feature, the second feature resides in a force detector, wherein any one of the displacement electrode and the fixed electrode, or both the electrodes are constituted by four groups of localized electrodes arranged in positive and negative directions of a first axis and a second axis perpendicular to each other on the surface where the localized electrodes are formed (hereinafter referred to as the electrode formation surface), thus to form four groups of capacitance elements by using the four groups of localized electrodes, respectively, a force component in the first axis direction being detected by a difference between electrostatic capacitance values of capacitance elements belonging to the two groups of capacitance elements on the first axis of the four groups of capacitance elements, a force component in the second axis direction being detected by a difference between electrostatic capacitance values of capacitance elements belonging to the two groups of capacitance elements on the second axis of the four groups of capacitance elements.

In the force detector having the above described second feature, four groups of localized electrodes are formed. When the electrode formation surface is defined as an XY plane, respective groups are formed on the both positive and negative sides of the X-axis and on the positive and negative sides of the Y-axis, respectively. When a force in the X-axis direction is exerted on the working body, since the electrostatic capacitance values with respect to the both groups positioned on the positive and negative sides of the X-axis complementarily changes, it is possible to detect a force in the X-axis direction by the difference between electrostatic capacitance values with respect to the both groups. Similarly, by the difference between electrostatic capacitance values with respect to the both groups positioned on the positive and negative sides of the Y-axis, it is possible to detect a force in the Y-axis direction.

(3) In the force detector having the above described first feature, the third feature resides in a force detector, wherein anyone of the displacement electrode and the fixed electrode or both the electrodes are constituted by four groups of localized electrodes arranged in positive and negative directions with respect to a first axis and a second axis perpendicular to each other on the electrode formation surface to form four groups of capacitance elements by using four groups of localized electrodes, respectively, a force component in the first axis direction being detected by a difference between electrostatic capacitance values of capacitance elements belonging to two groups of capacitance elements on the first axis of the four groups of capacitance elements, a force component in the second axis direction being detected by a difference between electrostatic capacitance values of capacitance elements belonging to two groups of capacitance elements on the second axis of the four groups of capacitance elements, a force component in the third axis direction perpendicular to the first axis and the second axis being detected by a sum of electrostatic capacitance values of capacitance elements belonging to four groups of capacitance elements.

In the force detector having the third feature, four groups of localized electrodes are formed. When the electrode formation surface is defined as an XY-plane, respective groups are formed on both the positive and negative sides of the X-axis and on both the positive and negative sides of the Y-axis. When a force in the X-axis direction is exerted on the working body, since the electrostatic capacitance values with respect to both the groups positioned on the positive and negative sides of the X-axis complementarily vary, it is possible to detect a force in the X-axis direction by the differences between electrostatic capacitance values with respect to the both groups. Similarly, it is possible to detect a force in the Y-axis direction by the differences between electrostatic capacitance values with respect to both the groups positioned on the positive and negative sides of the Y-axis. In addition, when a force in the Z-axis direction is exerted on the working body, since the electrostatic capacitance values with respect to the four groups vary in the same direction, it is possible to detect a force in the Z-axis direction by the sum thereof.

(4) In the force detector having the above described first feature, the fourth feature resides in a force detector, wherein any one of the displacement electrode and the fixed electrode, or both the electrodes are constituted by four groups of localized electrodes respectively arranged in positive and negative directions with respect to a first axis and a second axis perpendicular to each other on the electrode formation surface, and a fifth group of localized electrodes arranged at the intersecting point of the first axis and the second axis to form five groups of capacitance elements by using five groups of localized electrodes, respectively, a force component in the first axis direction being detected by a difference between electrostatic capacitance values of capacitance elements belonging to two groups of capacitance elements on the first axis of the five groups of capacitance elements, a force component in the second axis direction being detected by a difference between electrostatic capacitance values of capacitance elements belonging to two groups of capacitance elements on the second axis of the five groups of capacitance elements, a force component in a third axis perpendicular to the first axis and the second axis being detected by electrostatic capacitance values of capacitance elements using the fifth group of localized electrodes of the five groups of capacitance elements.

In the force detector having the fourth feature, since an exclusive capacitance element for detecting a force component in the third axis direction is formed, more accurate detected values can be provided.

(5) In the force detector having the above described first feature, the fifth feature resides in that the displacement electrode is formed at the working portion.

In the force detector having the fifth feature, since the displacement electrode is efficiently subjected to displacement, the sensitivity can be improved.

(6) In the force detector having the above described first feature, the sixth feature resides in a force detector, wherein there is further provided an auxiliary substrate so that the fixed substrate, the flexible substrate and the auxiliary substrate are oppositely arranged in order recited, respectively, wherein a first auxiliary electrode is formed on the surface facing to the auxiliary substrate of the flexible substrate, wherein a second auxiliary electrode is formed on the surface facing to the flexible substrate of the auxiliary substrate, and wherein a predetermined voltage is applied across the first auxiliary electrode and the second auxiliary electrode, or across the displacement electrode and the fixed electrode to allow the flexible substrate to produce displacement by a coulomb force exerted therebetween, thus permitting the force detector to be placed in the state equivalent to the state where a force is exerted thereon from the external.

In the force detector having the sixth feature, when a predetermined voltage is applied across respective electrodes, the flexible substrate is permitted to produce displacement by coulomb force exerted therebetween. Namely, the force detector can be place in the state equivalent to the state where a force is exerted thereon from the external. If such a state can be created, it becomes easy to test as to whether or not the detector normarily operates.

(7) In the force detector having the above described sixth feature, the seventh feature resides in a force detector, wherein the flexible substrate is constituted with a conductive material, and the first auxiliary electrode and the displacement electrode are formed by a portion of the conductive flexible substrate.

In the force detector having the seventh feature, the first auxiliary electrode and the displacement electrode are formed by a portion of the flexible substrate. Accordingly, the process step for newly forming the electrode is not particularly required. Thus, the structure becomes simple and the manufacturing cost can be reduced.

(8) The eighth feature resides in a force detector comprising:

a flexible substrate including a fixed portion fixed to a detector casing, a working portion to which a force is transmitted from the external, and a flexible portion having flexibility formed between the fixed portion and the working portion, a fixed substrate fixed on the detector casing so as to face the flexible substrate, a working body adapted to receive a force from the external to transmit this force to the working portion of the flexible substrate, a displacement electrode formed on the surface facing to the fixed substrate of the flexible substrate, a fixed electrode formed on the surface facing to the flexible substrate of the fixed substrate, and a piezo electric element formed in a manner that it is put between the displacement electrode and the fixed electrode to transform an applied pressure to an electric signal by both the electrodes to output it to both the electrodes, to detect a force exerted on the working body by an electric signal outputted from the pizeo electric element.

In the force detector having the eighth feature, when a force from the external is applied to the working body, the flexible substrate is bent. Thus, a pressure is applied to the piezo electric element put between the displacement electrode and the fixed electrode. Since this pressure is outputted as an electric signal, an external force can be detected as an electric signal as it is.

(9) In the force detector having the above described eighth feature, the ninth feature resides in a force detector wherein a plurality of displacement electrodes are formed on one surface of the piezo electric element and a plurality of fixed electrodes are formed on the other surface, thus to detect a force exerted on the working body every plural directional components by electric signals obtained from the plurality of electrodes.

In the force detector having the ninth feature, it is possible to detect force components in plural directions by using a single piezo electric element.

(10). In the detectors having the above described first to ninth features, the tenth feature resides in a detector wherein the working body is constituted with a magnetic material to detect a force produced on the basis of a magnetic force exerted on the working body, thereby making it possible to carry out detection of magnetism.

2. Feature Relating to the Manufacturing Method

To attain the above-described second object, the manufacturing method according to this invention has the following features.

(1) In a method of manufacturing a physical quantity detector utilizing changes in an electrostatic capacitance, the first feature resides in a method comprising the steps of:

defining a working region, a flexible region adjacent to the working region, and a fixed region adjacent to the flexible region at a first substrate, forming a first electrode layer on a first surface of the first substrate, carrying out a processing for partially removing the first substrate in order to allow the flexible region to have flexibility, connecting a first surface of a second substrate to a second surface of the first substrate, cutting the second substrate to thereby form a working body connected to the working region of the first substrate and comprised of a portion of the second substrate, and a pedestal connected to the fixed region of the first substrate and comprised of a portion of the second substrate, and forming a groove on a first surface of a third substrate to, form a second electrode layer on the bottom surface of the groove to connect the third substrate to the first substrate so that the second electrode layer faces to the first electrode layer with a predetermined spacing therebetween.

In accordance with the manufacturing method having the first feature, a weight body or a magnetic body (these members are generically called a working body in this application) are formed by a portion of the second substrate, and a pedestal for supporting the first substrate is formed by another portion thereof. Namely, by cutting the second substrate, both the working body and the pedestal can be formed, so the physical quantity detector can be efficiently manufactured.

(2) In a method of manufacturing a physical quantity detector utilizing changes in an electrostatic capacitance, the second feature resides in a method comprising the steps of:

defining a working region, a flexible region adjacent to the working region, and a fixed region adjacent to the flexible region at a first substrate, forming a first electrode layer on a first surface of the first substrate, carrying out a processing for partially removing the first substrate in order to allow the flexible region to have flexibility, connecting a first surface of a second substrate to a second surface of the first substrate, cutting the second substrate to thereby form a working body connected to the working region of the first substrate and comprised of a portion of the second substrate, and a pedestal connected to the fixed region of the first substrate and comprised of a portion of the second substrate, forming, on a first surface of a third substrate, a groove such that the working body can move with a predetermined degree of freedom, thereafter to connect the first surface of the third substrate to a second surface of the second substrate, and forming a groove on a first surface of a fourth substrate to form a second electrode layer on the bottom surface of the groove to connect the fourth substrate to the first substrate so that the second electrode layer faces to the first electrode layer with a predetermined spacing therebetween.

In accordance with the manufacturing method having the second feature, a control member for limiting movement in a lower direction of the working body can be formed by a different substrate.

(3) In a method of manufacturing a physical quantity detector utilizing changes in an electrostatic capacitance, the third feature resides in a method comprising the steps of:

defining a working region, a flexible region adjacent to the working region, and a fixed region adjacent to the flexible region at a first substrate, forming a first electrode layer on a first surface of the first substrate, carrying out a processing for partially removing the first substrate in order to allow the flexible region to have flexibility, forming, on a first surface of a second substrate, a groove such that the working region can move with a predetermined degree of freedom, thereafter to connect the first surface of the second substrate to a second surface of the first substrate, forming a groove on a first surface of a third substrate to form a second electrode layer on the bottom surface of the groove to connect the third substrate to the first substrate so that the second electrode layer faces to the first electrode layer with a predetermined spacing therebetween.

As compared to the manufacturing method having the previously described second feature, the manufacturing method having the third feature becomes more simple.

(4) In the manufacturing methods having the above described first to third features, the fourth feature resides in a method in which a plurality of unit regions are defined on respective substrates to form single independent detectors every unit regions to finally separate them every respective unit regions.

In accordance with the manufacturing method having the fourth feature, it is possible to mass produce respective detectors.

BRIEF DESCRIPTION OF THE DRAWINGS

FIGS. 28a and 28b are a side cross sectional view and a bottom view of the main substrate 100 shown in FIG. 27a.

FIGS. 29a and 29b are a side cross sectional view and a top view of the auxiliary substrate 200 shown in FIG. 27b.

FIGS. 30a and 30b are a side cross sectional view and a top view of the control substrate 300 shown in FIG. 27d.

FIGS. 31a and 31b are a side cross sectional view and a bottom view of the supplementary substrate 400 shown in FIG. 32a.

FIG. 33 is a perspective view showing an acceleration sensor center portion manufactured by the method shown in FIGS. 32a to 32c.

FIG. 34 is a side cross sectional view showing the state where the acceleration sensor center portion shown in FIG. 33 is accommodated into the package.

FIG. 35 is a perspective view showing an acceleration sensor center portion manufactured by the method according to another embodiment of this invention.

FIGS. 36a and 36b are a side cross sectional view and a top view of the control substrate 300' used in a method according to the last mentioned embodiment of this invention.

FIGS. 37a and 37b are a side cross sectional view and a bottom view of the supplementary substrate 400' used in the method according to the last mentioned embodiment of this invention.

DESCRIPTION OF THE PREFERRED EMBODIMENTS

§1 Basic Embodiment

Figure 1:
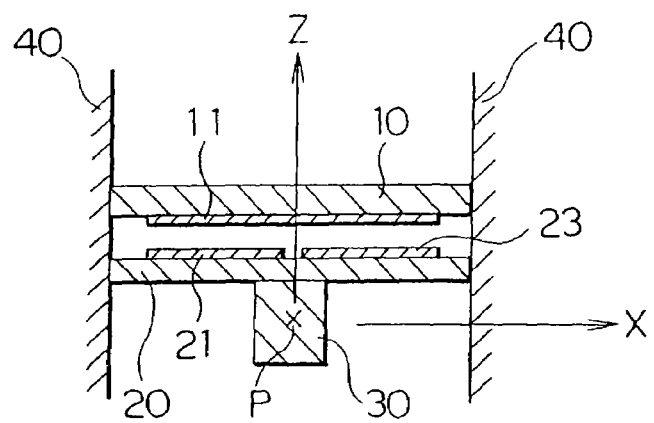
FIG. 1 is a side cross sectional view showing the structure of an acceleration detector according to a basic embodiment of this invention.
Figure 2:
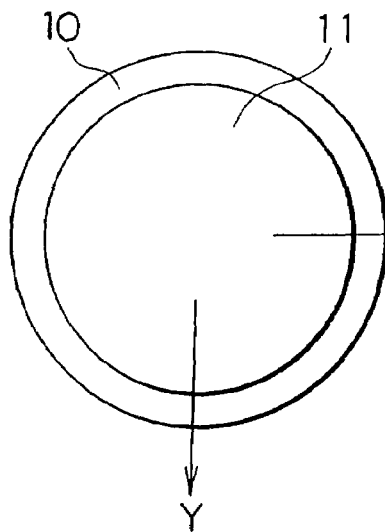
FIG. 2 is a bottom view of the fixed substrate in the detector shown in FIG. 1.
Figure 3:
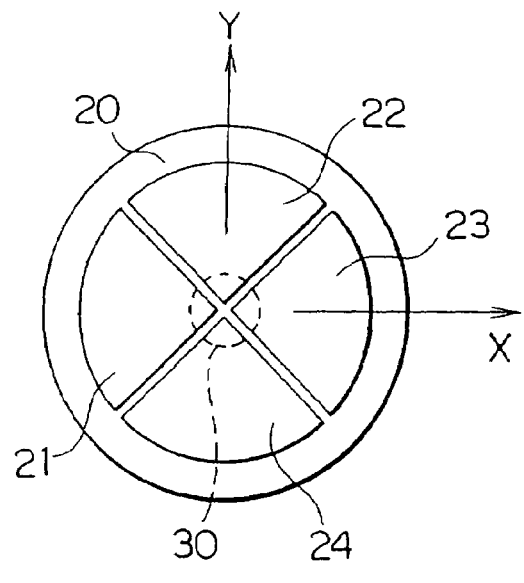
FIG. 3 is a top view of the flexible substrate in the detector shown in FIG. 1.

FIG. 1 is a side cross sectional view showing the structure of an acceleration detector according to a basic embodiment of this invention. This detector comprises, as the major component, a fixed substrate 10, a flexible substrate 20, a working body 30, and a detector casing 40. The bottom view of the fixed substrate 10 is shown in FIG. 2. The cross section cut along the X-axis of the fixed substrate 10 in FIG. 2 is shown in FIG. 1. The fixed substrate 10 is formed as a disk shaped substrate as shown, and is fixed at the peripheral portion thereof to the detector casing 40. On the lower surface thereof, a disk shaped fixed electrode 11 is similarly formed. On the other hand, the top view of the flexible substrate 20 is shown in FIG. 3. The cross section cut along the X-axis of the flexible substrate in FIG. 3 is shown in FIG. 1. The flexible substrate 20 is also formed as a disk shaped substrate as shown, and is fixed at the peripheral portion thereof to the detector casing 40. On the upper surface thereof, quadrant disk shaped displacement electrodes 21 to 24 are formed. The working body 30 is columnar as the upper surface thereof is indicated by broken lines in FIG. 3, and is coaxially connected to the lower surface of the flexible substrate 20. The detector casing 40 is cylindrical, and fixes and supports the peripheral portions of the fixed substrate 10 and the flexible substrate 20.

The fixed substrate 10 and the flexible substrate 20 are arranged with a predetermined spacing therebetween at positions in parallel to each other. While both substrates are a disk shaped substrate, the fixed substrate 10 is a substrate having high rigidity such that bending is difficult to occur, whereas the flexible substrate 20 is a substrate having flexibility such that when a force is applied, bending occurs. It is now assumed that the working point P is defined at the center of gravity of the working body 30 as shown in FIG. 1, and that the XYZ three-dimensional coordinate system having the working point P as the origin is defined as shown. Namely, the X-axis is defined in a right direction of FIG. 1, the Z-axis is defined in an upper direction thereof, and the Y-axis is defined in a direction perpendicular to the plane surface of paper and extending toward the back side of the plane surface of paper.

Figure 4:
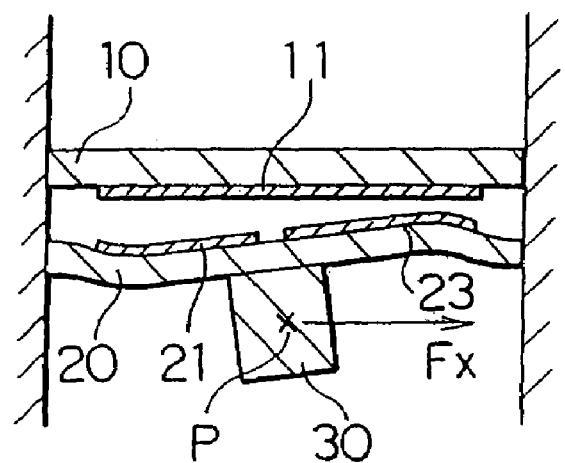
FIG. 4 is a side cross sectional view showing the state where a force Fx in an X-axis direction is exerted on the detector shown in FIG. 1.
Figure 5:
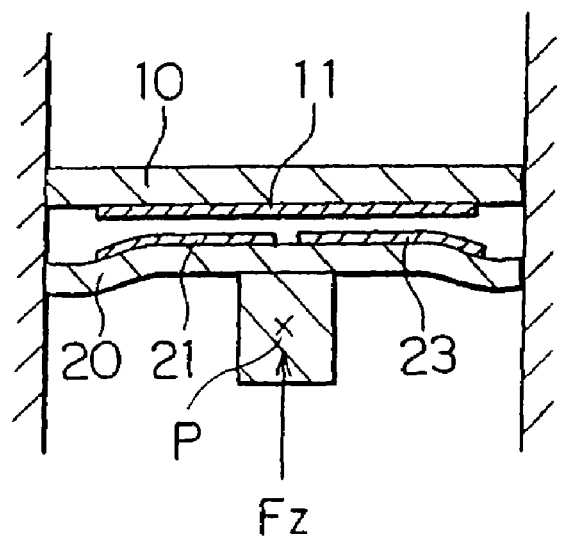
FIG. 5 is a side cross sectional view showing the state where a force Fz in a Z-axis direction is exerted on the detector shown in FIG. 1.

Assuming now that the entirety of this detector is mounted, e.g., in an automotive vehicle, an acceleration will be applied to the working body 30 on the basis of running of the automotive vehicle. By this acceleration, an external force is exerted on the working point P. In the state where no force is exerted on the working point P, as shown in FIG. 1, the fixed electrode 11 and the displacement electrodes 21 to 24 are maintained in a parallel state with a predetermined spacing therebetween. However, if a force Fx in the X-axis direction is exerted on the working point P, this force Fx allows the flexible substrate 20 to produce a moment force. As a result, as shown in FIG. 4, bending will be produced in the flexible substrate 20. By this bending, the spacing between the displacement electrode 21 and the fixed electrode 11 is increased, but the spacing between the displacement electrode 23 and the fixed electrode 11 is decreased. When a force exerted on the working point P is assumed to be −Fx in an opposite direction, bending having the relationship opposite to the above will be produced. On the other hand, in the case where a force Fy or −Fy in the Y-axis direction is exerted, changes similar to the above are produced in connection with the spacing between the displacement electrode 22 and the fixed electrode 11 and the spacing between the displacement electrode 24 and the fixed electrode 11. Further, in the case where a force Fz in the Z-axis direction is exerted, as shown in FIG. 5, all the displacement electrodes 21 to 24 become close to the fixed electrode 11. In contrast, in the case where a force −Fz in an opposite direction is exerted, all the displacement electrodes 21 to 24 are remote from the fixed electrode 11.

Here let consider the capacitance elements constituted with respective electrodes. The lower surface of the fixed substrate 10 shown in FIG. 2 and the upper surface of the flexible substrate 20 shown in FIG. 3 are opposite to each other. Accordingly, the opposite relationship between electrodes is such that the displacement electrodes 21 to 24 face the opposite portions of the fixed electrode 11, respectively. In other words, the fixed electrode 11 serves as a single common electrode, whereas the displacement electrodes 21 to 24 serve as localized electrodes localized in the quadrant regions, respectively. Although the common electrode is provided as the single common electrode, since four localized electrodes are respectively independent from an electrical point of view, four groups of capacitance electrodes can be formed with respect to the electric characteristic. The capacitance elements belonging to the first group are combination of the displacement electrode 21 arranged in a negative direction of the X-axis and the fixed electrode 11. The capacitance elements belonging to the second group are combination of the displacement electrode 22 arranged in a positive direction of the Y-axis and the fixed electrode 11. The capacitance elements belonging to the third group are combination of the displacement electrode 23 arranged in a positive direction of the X-axis and the fixed electrode 11. In addition, the capacitance elements belonging to the forth group are combination of the displacement electrode 24 arranged in a negative direction of the Y-axis and the fixed electrode 11. It is now assumed that the electrostatic capacitance values of the respective capacitance elements are represented by C1, C2, C3 and C4. In the state where no force is exerted on the working point P as shown in FIG. 1, the electrode intervals of respective capacitance elements are all kept at the same value, so the electrostatic capacitance values all take a standard value C0. Namely, the relationship expressed as C1=C2=C3=C4 holds. However, when a force is exerted on the working point P, as shown in FIG. 4 or 5, so bending is produced in the flexible substrate 20, the electrode intervals of the respective capacitance elements vary. As a result, their electrostatic capacitance values become values different from the standard value C0. When it is assumed that an area of an electrode, an electrode interval and a dielectric constant are represented by S, d and ∈, respectively, an electrostatic capacitance C of a capacitance element is generally determined by the following equation;

$C = \in S/d$.

Accordingly, when the electrode interval becomes short, the electrostatic capacitance C becomes long, while when it becomes large, the electrostatic capacitance C becomes small.

For example, when a force Fx in the X-axis direction is exerted on the working point P as shown in FIG. 4, since the interval between the displacement electrode 21 and the fixed electrode 11 becomes long, the relationship expressed as C1<C0 holds. On the contrary, since the interval between the displacement electrode 23 and the fixed electrode 11 becomes short, the relationship expressed as C3>C0 holds. At this time, since the intervals between displacement electrodes 22 and 24 and the fixed electrode 11 are such that they partially become short, and partially become long, the both portions are canceled. Thus, the relationship expressed as C2=C4=C0 holds, resulting in no change in the electrostatic capacitance. On the other hand, when a force Fz in the Z-axis direction is exerted on the working point P as shown in FIG. 5, the intervals between displacement electrodes 21 to 24 and the fixed electrode 11 all become short. As a result, the relationship expressed as (C1 to C4)>C0 holds. As stated above, the pattern showing how electrostatic capacitance values of the four groups of capacitance elements vary in dependency upon the direction of a force exerted.

Figures 6, 7:
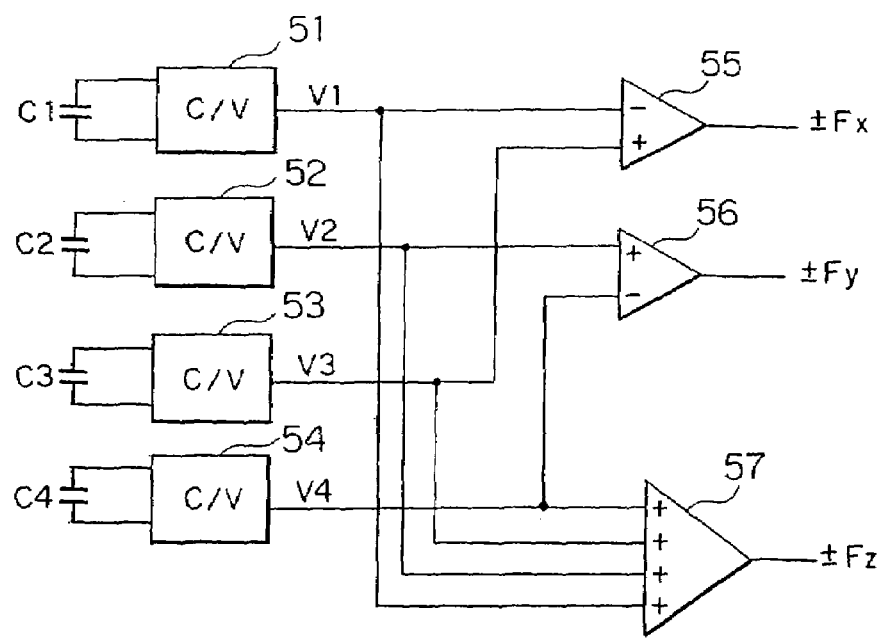
FIG. 6 is a Table showing the principle of the force detection in the detector shown in FIG. 1.
FIG. 7 is a circuit diagram showing a detection circuit to be applied to the detector shown in FIG. 1.

FIG. 6 is a Table showing the pattern of how electrostatic capacitance values of the four groups of capacitance elements vary. In this Table, "0" indicates that there is no change in the electrostatic capacitance (i.e., takes the standard value C0 as it is), "+" indicates that the electrostatic capacitance is increased, and "−" indicates that the electrostatic capacitance is decreased. For example, the column of Fx of FIG. 6 indicates, as shown in FIG. 4, changes in respective electrostatic capacitance values C1 to C4 when a force Fx in the X-axis direction is exerted on the working point P. In this case, as previously described, C1 becomes small, C3 becomes large, and C2 and C4 indicate no change. As stated above, on the basis of the pattern showing how respective electrostatic capacitance values vary, the direction of a force exerted can be recognized. Further, by detecting the degree of the change (i.e., to such an extent that the electrostatic capacitance increases, or decreases), the magnitude of a force exerted can be recognized.

The basic circuit for detecting force components exerted every respective axial directions is shown in FIG. 7. Converters 51 to 54 are constituted with circuits for converting electrostatic capacitance values C1 to C4 of the capacitance elements to voltage values V1 to V4, respectively. For example, there may be employed a circuit configuration to convert an electrostatic capacitance value C to a frequency value f by using a CR oscillator, etc. thereafter to further convert the frequency value f to a voltage value V by using a frequency/voltage converter. As a matter of course, means for directly converting an electrostatic capacitance value to a voltage value may be employed. The differential amplifier 55 serves to take a difference between voltage values V1 and V3 to output it as a component ±Fx in the X-axis direction of a force to be detected. As seen with reference to the columns of Fx and −Fx of FIG. 6, the component ±Fx in the X-axis direction is determined by taking a difference between C1 and C3. Further, the differential amplifier 56 serves to take a difference between voltage values V2 and V4 to output it as a component ±Fy in the Y-axis direction of a force to be detected. As seen with reference to the columns of Fy and −Fy, the component ±Fy in the Y-axis direction is determined by taking a difference between C2 and C4. As stated above, when an approach is employed to determine the components in the X-axis and Y-axis directions on the basis of difference, influences due to temperature, etc. can be canceled. As a result, good precision detected values can be provided. Further, the linearity of the detected values is improved. In addition, the adder 57 serves to take sum of voltage values V1 to V4 to output it as a component ±Fz in the Z-axis direction of a force to be detected. As seen with reference to the columns of Fz and −Fz of FIG. 6, the component ±Fz in the Z-axis direction is determined by taking sum of C1 to C4.

On the basis of the principle as mentioned above, predetermined wirings are implemented to respective electrodes shown in FIGS. 2 and 3 to constitute a detection circuit as shown in FIG. 7. Thus, a force exerted on the working point P can be detected as electric signals every respective components in the three-dimensional axial directions. Namely, an acceleration exerted on the working body 30 can be detected as electric signals every respective components in the three-dimensional axial directions. Since detections of respective components in the axial directions are exactly independently carried out, interference with other axes does not take place, so precise detection can be made. Further, the temperature dependency of the detected value is to a negligible degree, resulting in no necessity of processing for temperature compensation. In addition, since the detector can be realized with a simple structure in which electrodes are only formed on the structure, the manufacturing cost is also low.

It is to be noted that the detection circuit of FIG. 7 is illustrated as an example, and therefore other circuits may be of course employed. For example, a CR oscillating circuit may be used to convert an electrostatic capacitance value to a frequency value to input it to a microprocessor to determine three-dimensional acceleration components by digital computation.

§2 Embodiment Showing Materials of Respective Parts

Subsequently, materials of respective parts constituting the above described force detector will be described. To carry out detection based on the above described principle, it is sufficient that the following conditions are satisfied with respect to the materials.

(1) Respective electrodes are comprised of conductive material.

(2) Respective localized electrodes are electrically insulated from each other.

(3) The flexible substrate is comprised of material having flexibility.

As long as such conditions are satisfied, any material may be used. Here, preferred embodiments using practical material will now be described.

Figure 8:
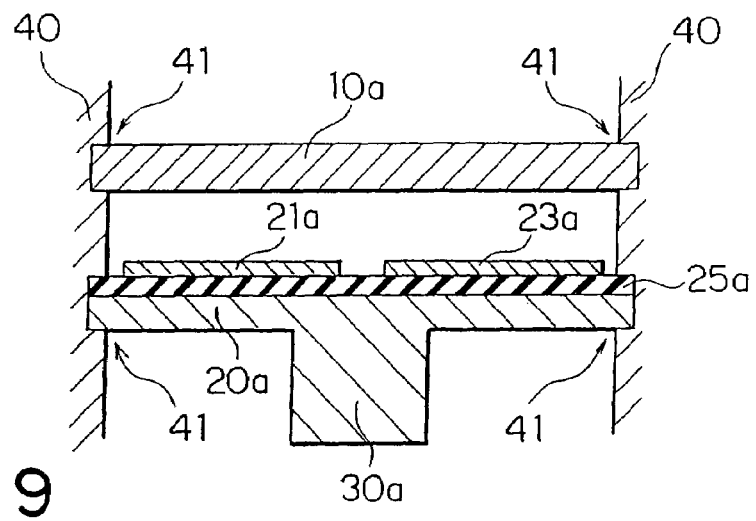
FIG. 8 is a cross sectional view showing the embodiment where respective substrates in the detector shown in FIG. 1 are constituted with metal material.

The embodiment shown in FIG. 8 is directed to the example where metal is used in all of the fixed substrate 10a, the flexible substrate 20a, the working body 30a. The flexible substrate 20a and the working body 30a are integrally formed. Of course, an approach may be employed to individually prepare these members thereafter to connect them to each other. The detector casing 40 is formed, e.g., by metal or plastic, etc., and fixes and supports respective substrates by fitting the peripheral portions of respective substrates into the supporting grooves 41 formed on the inner surfaces thereof. Since the fixed substrate 10a itself functions as the fixed electrode 11 as it is, there is no need of separately forming the fixed electrode 11. Since the flexible substrate 20a is comprised of metal, it is impossible to directly form thereon displacement electrodes 21a to 24a. In view of this, displacement electrodes 21a to 24a are formed on the flexible substrate 20a through an insulating layer 25a of material such as glass or ceramic. In this case, in order to allow the flexible substrate 20a to have flexibility, it is sufficient that the flexible substrate 20a is caused to be easily deformed by allowing the flexible substrate to have small thickness, or allowing it to be wave shaped.

Figure 9:
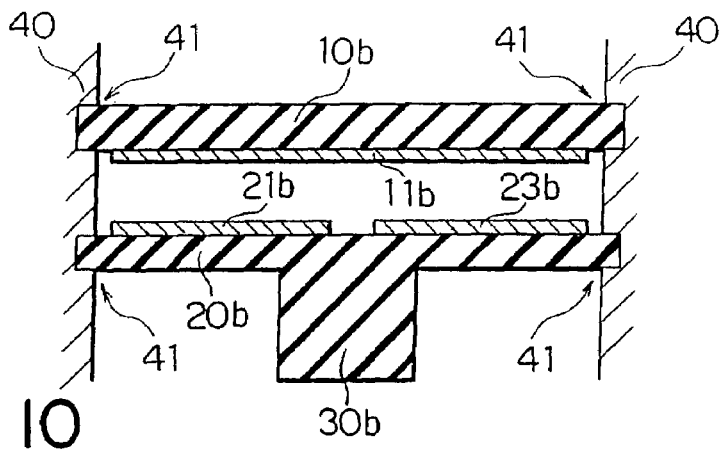
FIG. 9 is a cross sectional view showing the embodiment where respective substrates in the detector shown in FIG. 1 are constituted with insulating material.

The embodiment shown in FIG. 9 is directed to the example where an insulating body such as glass or ceramic, etc. is used in all of the fixed substrate 10b, the flexible substrate 20b and the working body 30b. The flexible substrate 20b and the working body 30b are integrally formed. The detector casing 40 is formed by metal or plastic, and fixes and supports respective substrates by fitting the peripheral portions of respective substrates into supporting grooves 41 formed on the inner surfaces thereof. On the lower surface of the fixed substrate 10b, a fixed electrode 11b comprised of metal is formed. Further, on the upper surface of the flexible substrate 20b, displacement electrodes 21b to 24b comprised of metal are formed. In order to allow the flexible substrate 20b to have flexibility, the thickness thereof may be caused to be small, or synthetic resin having flexibility may be used in place of glass or ceramic. Alternatively, through holes may be partially provided in the flexible substrate 20b to allow it to be easily deformed.

Figure 10:
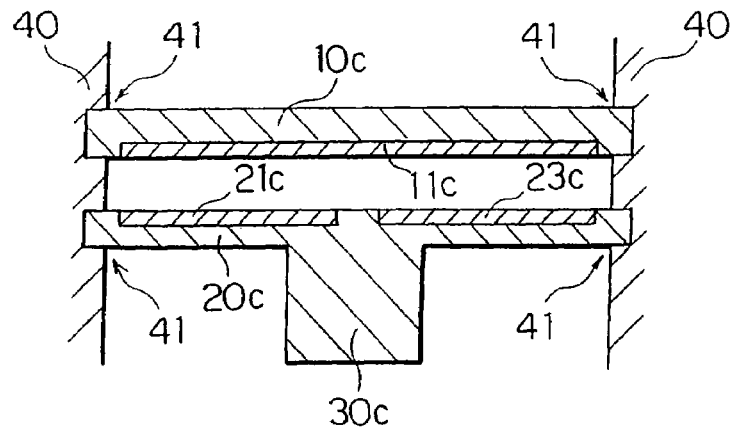
FIG. 10 is a cross sectional view showing the embodiment where respective substrates in the detector shown in FIG. 1 are constituted with semiconductor material.

The embodiment shown in FIG. 10 is directed to the example where semiconductor such as silicon is used in all of the fixed substrate 10c, the flexible substrate 20c and the working body 30c. The flexible substrate 20c and the working body 30c are integrally formed. The detector casing 40 is formed by metal or plastic, and fixes and supports respective substrates by fitting the peripheral portions of respective substrates into supporting grooves 41 formed on the inner surface thereof. The fixed electrode 11c positioned internally on the lower surface of the fixed substrate 10c and the displacement electrodes 21c to 24c positioned internally on the upper surface of the flexible substrate 20c are formed by diffusing impurity at a high concentration. In order to allow the flexible substrate 20c to have flexibility, the thickness thereof may be caused to be small, or through holes may be partially provided.

In addition, various embodiments are conceivable. If a silicon substrate is used, the detector may be of more simple structure by making use of the etching processing. For example, when an approach is employed to form grooves by etching at the lower surface of the fixed substrate 10c to form electrodes on the bottom surfaces of these grooves, there may be provided a structure in which the fixed substrate 10c and the flexible substrate 20c are directly connected to each other.

While explanation has been given in connection with the example where metal, insulating body and semiconductor body are used as the material of respective components, combination of such materials may be used as the respective components.

Figure 11:
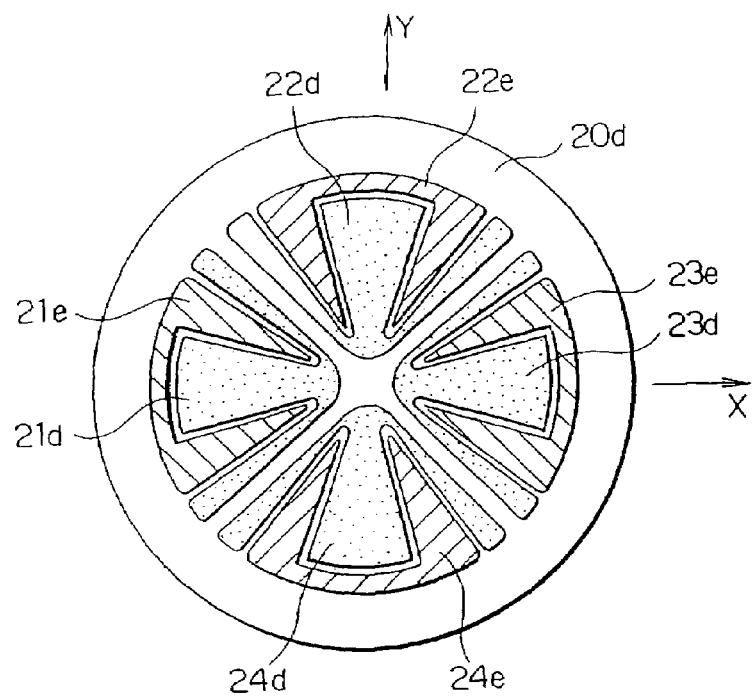
FIG. 11 is a top view of the flexible substrate of an acceleration detector according to another embodiment of this invention.

§3 Embodiment for Detecting Components in Three Axial Directions by Independent Electrodes In the previously described basic embodiment, the detection circuit as shown in FIG. 7 was illustrated. In this detection circuit, the same capacitance elements are used as the capacitance element for detecting ±Fx or ±Fy and the capacitance element for detecting ±Fz. In other words, by using a single localized electrode for two kinds of capacitance elements, components in two axial directions were detected. In the embodiment which will be described below, components in three axial directions are detected by exactly independent exclusive electrodes. The top view of a flexible substrate 20d used in the embodiment is shown in FIG. 11. As compared to the flexible substrate 20 in the basic embodiment shown in FIG. 3, the formation pattern of localized electrodes are somewhat complicated. Eight localized electrodes in total are formed. The eight localized electrodes are classified into four groups. The localized electrodes belonging to the first group are electrodes 21d and 21e arranged in a negative direction of the X-axis. The localized electrodes belonging to the second group are electrodes 22d and 22e arranged in a positive direction of the Y-axis. The localized electrodes belonging to the third group are electrodes 23d and 23e arranged in a positive direction of the X-axis. The localized electrodes belonging to the fourth group are electrodes 24d and 24e arranged in a negative direction of the Y-axis.

Figure 12:
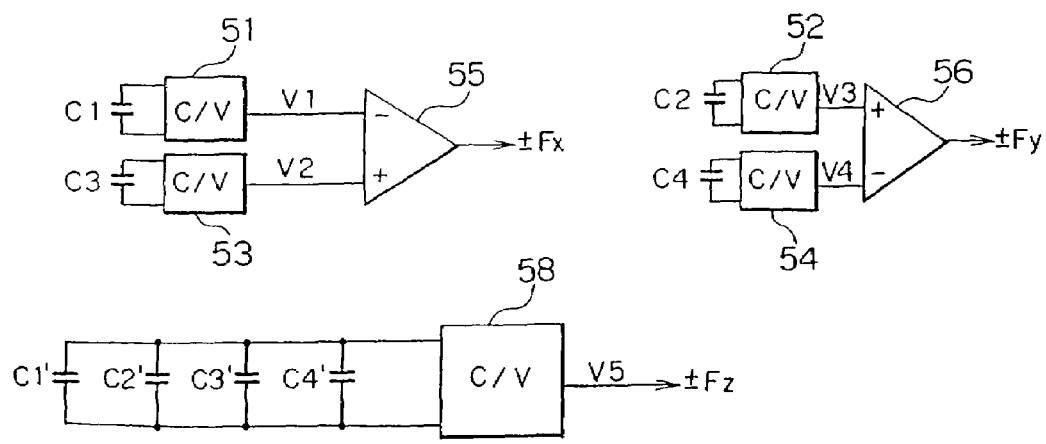
FIG. 12 is a circuit diagram showing a detection circuit to be applied to the detector shown in FIG. 11.

It is now assumed that the electrostatic capacitance values of four capacitance elements comprised of combinations of respective four electrodes 21d to 24d to which hatching by dots is implemented in FIG. 11 and the fixed electrode 11 opposite thereto are respectively represented by C1 to C4, and that the electrostatic capacitance values of four capacitance elements comprised of combinations of respective four electrodes 21e to 24e to which hatching by slanting lines is implemented and the fixed electrode 11 opposite thereto are respectively represented by C1' to C4'. With respect to eight capacitance elements, a detection circuit as shown in FIG. 12 is constituted. Here, converters 51 to 54 are circuits for converting electrostatic capacitance values C1 to C4 to voltages V1 to V4, and differential amplifiers 55 and 56 are circuits for amplifying and outputting a difference between inputted two voltage values. In the same manner as in the previously described basic embodiment, the differential amplifiers 55 and 56 output detected values of ±Fx and ±Fy, respectively. The feature of this embodiment resides in that four electrostatic capacitors C1' to C4' are connected in parallel to generate a voltage V5 corresponding to sum of these capacitance values by the converter 58 to output it as a detected value of Fz. When consideration of the principle of detection is made in connection with the localized electrode shown in FIG. 11, ±Fx is detected by the electrodes 21d and 23d, ±Fy is detected by the electrodes 22d and 24d, and ±Fz is detected by the electrodes 21e, 22e, 23e and 24e. In this way, components in three axial directions can be detected by individual and independent electrodes.

While there has been illustrated the example where the electrodes 21d to 24e are respectively constituted with independent electrodes for convenience of explanation, as apparent from the circuit diagram of FIG. 12, in practice, capacitance elements constituted with electrodes 21e to 24e are connected in parallel. Accordingly, these four electrodes may be integrally formed on the flexible substrate 20d. Further, in the circuit diagram of FIG. 12, similar detection can be made by the circuit in which C1, C2, C3 and C4 are replaced by C1', C2', C3' and C4', respectively.

This embodiment is convenient in the case of adjusting the detection sensitivities every respective components in the axial directions. For example, in FIG. 11, if the areas of the electrodes 21e, 22e, 23e and 24e to which hatching by slating lines is implemented of the figure are caused to be broad, the detection sensitivity in the Z-axis direction can be increased. Generally in the detector capable of detecting components in three axial directions, it is preferable to make a design so that respective detection sensitivities of three axes are substantially equal to each other. In this embodiment, by adjusting the area ratio between the region where hatching by slanting lines is implemented and the region where hatching by dot is implemented of FIG. 11, respective detection sensitivities of three axes can be substantially equal to each other.

Figure 13:
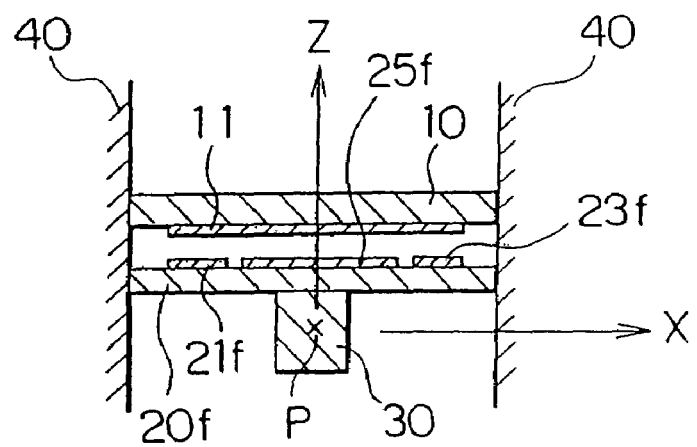
FIG. 13 is a side cross sectional view showing the structure of an acceleration detector according to a further embodiment of this invention.

The cross sectional view of another embodiment of a detector capable of detecting components in three axial directions by independent electrodes is shown in FIG. 13. As seen when compared to the basic embodiment shown in FIG. 1, the feature of the embodiment resides in that the flexible electrode is constituted by five electrodes. Namely, as seen from the top view shown in FIG. 14, on the upper surface of the flexible substrate 20f, sector shaped displacement electrodes 21f to 24f and a disk shaped displacement electrode 25f are formed.

Figure 15:
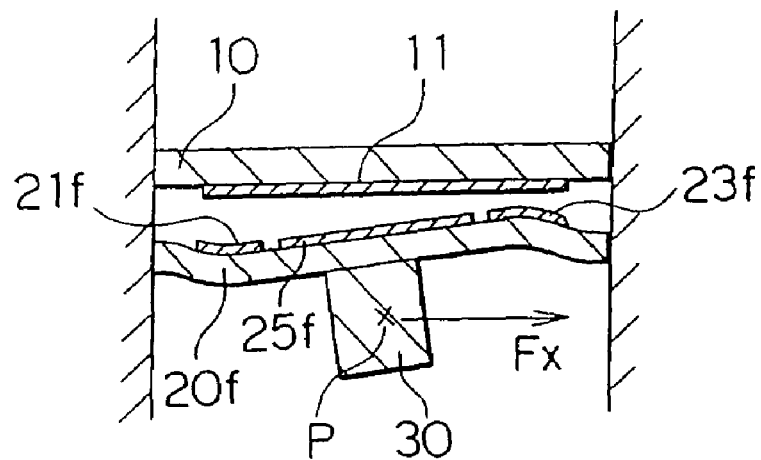
FIG. 15 is a side cross sectional view showing the state where a force Fx in an X-axis direction is exerted on the detector shown in FIG. 13.
Figure 16:
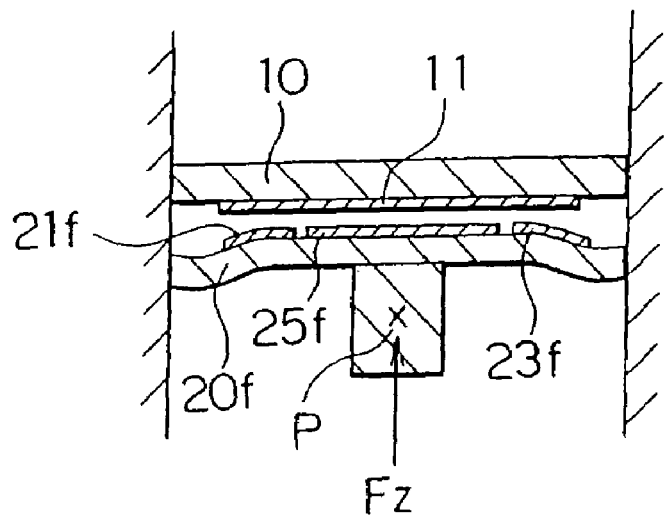
FIG. 16 is a side cross sectional view showing the state where a force Fz in an Z-axis direction is exerted on the detector shown in FIG. 13.

The detecting operation by this detector is as follows. Initially, when a force. Fx in the X-axis direction is exerted on the working point P, this force Fx allow the flexible substrate 20f to produce a moment force, so bending will be produced in the flexible substrate 20f as shown in FIG. 15. By this bending, the interval between the displacement electrode 21f and the fixed electrode 11 is increased, whereas the interval between the displacement electrode 23f and the fixed electrode 11 is decreased. When it is assumed that a force exerted on the working point P is −Fx in an opposite direction, a bending having the relationship opposite to the above will be produced. As stated above, when the force Fx or −Fx is exerted, there occurs changes in the electrostatic capacitance with respect to the displacement electrodes 21f and 23f. By detecting such changes, the force Fx or −Fx can be detected. At this time, the intervals between respective displacement electrodes 22f, 24f and 25f and the fixed electrode 11 are partially increased or decreased. However, it can be considered that such intervals do not change as a whole. On the other hand, in the case where a force Fy or −Fy in the Y-axis direction is exerted, similar changes are produced only in connection with the interval between the displacement electrode 22f and the fixed electrode 11 and the interval between the displacement electrode 24f and the fixed electrode 11. Further, in the case where a force Fz in the Z-axis direction is exerted, as shown in FIG. 16, the interval between the displacement electrode 25f and the fixed electrode 11 is decreased. In the case where a force −Fz in the opposite direction is exerted, the interval therebetween is increased. At this time, the intervals between displacement electrodes 21f to 24f and the fixed electrode 11 is decreased or increased wherein the change relating to the displacement electrode 25f is most conspicuous. Thus, by detecting changes in the electrostatic capacitance relating to the displacement electrode 25f, it is possible to detect the force Fz or −Fz. In addition, since detections in the X-axis and Y-axis directions are carried out on the basis of the difference, there is no possibility that such detections undergo influence with other components in the axial directions.

Figure 17:
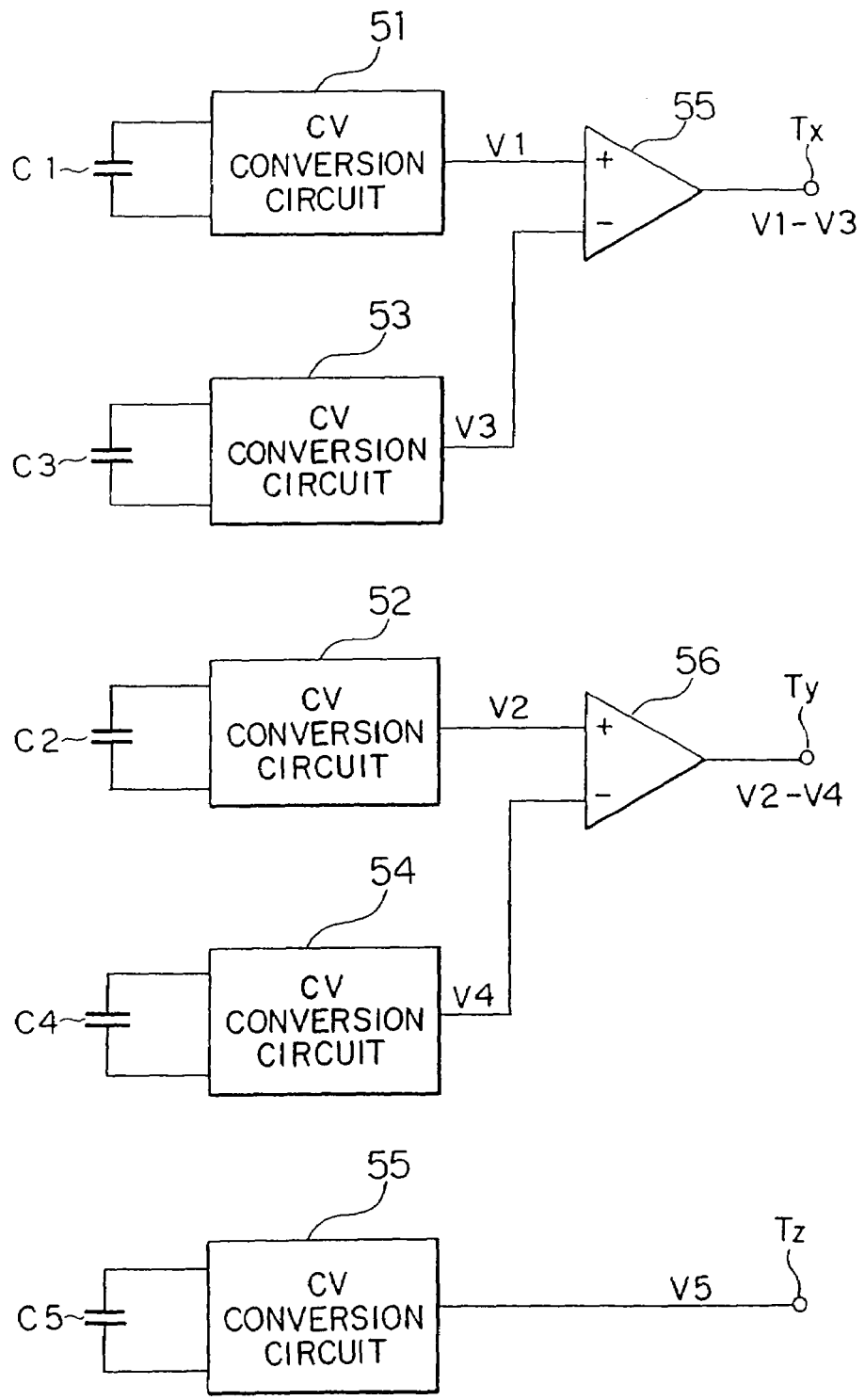
FIG. 17 is a circuit diagram showing a detection circuit to be applied to the detector shown in FIG. 13.

Actually, acceleration components in respective axial directions are detected by a detection circuit as shown in FIG. 17. Namely, the electrostatic capacitance values of capacitance elements C1 to C5 respectively comprised of the displacement electrodes 21f to 25f and the fixed electrode 11 are converted to voltage values V1 to V5 by CV conversion circuits 51 to 55, respectively. An acceleration in the X-axis direction is provided on the terminal Tx as a difference voltage obtained by performing calculation of (V1−V3) by a subtracter 55. An acceleration in the Y-axis direction is provided on the terminal Ty as a difference voltage obtained by performing calculation of (V2−V4) by a subtracter 56. In addition, an acceleration in the Z-axis direction is provided on the terminal Tz as a voltage V5 as it is.

§4 Embodiment in which the Electrode Formation Pattern is Changed

Figure 18:
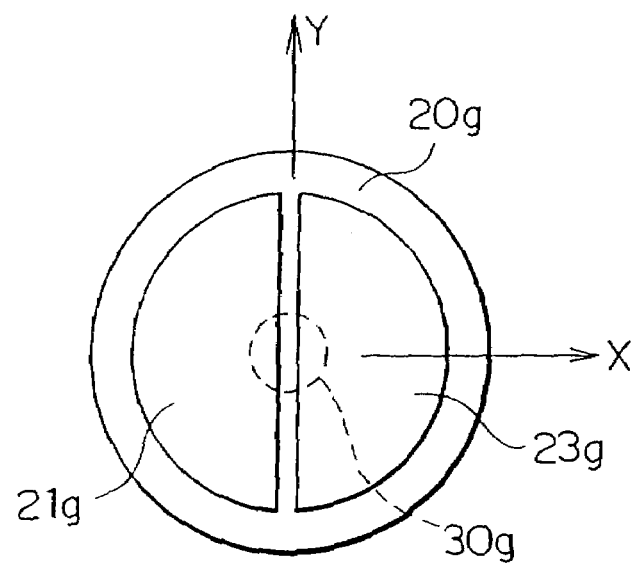
FIG. 18 is a plan view of the flexible substrate of the embodiment where only two dimensional detection is carried out.

In the basic embodiment described in the §1, as shown in FIG. 2, the fixed electrode 11 formed on the fixed substrate 10 is constructed as a single common electrode, and the displacement electrodes formed on the flexible substrate 20 are constructed as four localized electrodes 21 to 24. However, this invention is not limited to such a configuration, but a configuration exactly opposite to the above may be employed. Namely, the fixed electrode 11 formed on the fixed substrate 10 is constructed as four localized electrodes, and the displacement electrodes formed on the flexible substrate 20 are constructed as a single common electrode. Alternatively, four localized electrodes may be formed on the both substrates, respectively. Also in the embodiment using five localized electrodes shown in FIG. 13, similar configuration may be employed. Further, the number of localized electrodes formed on a single substrate is not necessarily required to be four or five. For example, eight or sixteen localized electrodes may be formed. Furthermore, as in the flexible substrate 20g shown in FIG. 18, only two localized electrodes 21g and 23g may be formed. In this case, detection of the component in the Y-axis direction cannot be carried out, but detections relating to two dimensions of the component in the X-axis direction and the component in the Z-axis direction can be made. In addition, in the case where only a detection relating to one dimension is carried out, it is sufficient that single electrodes are formed on the both substrates, respectively. Further, it is not limited that the electrode is formed circular or sector shaped, but the electrode may take any form. In addition, respective substrates are not necessarily required to be disk shaped.

§5 Embodiment Having Test Function

Generally, in the case of mass producing any detectors to deliver them to the market, the test process is conducted prior to shipping. That is, the work for confirming whether or not the detector normarily carries out the detecting operation is conducted. Also in the previously described acceleration detector, it is preferable to carry out a test prior to shipping. In order to test the acceleration detector, an approach is generally employed to actually apply an acceleration thereto and confirm an electric signal outputted at this time. However, an equipment for producing an acceleration is required for such a test. As a result, the test system becomes large.

Figure 19:
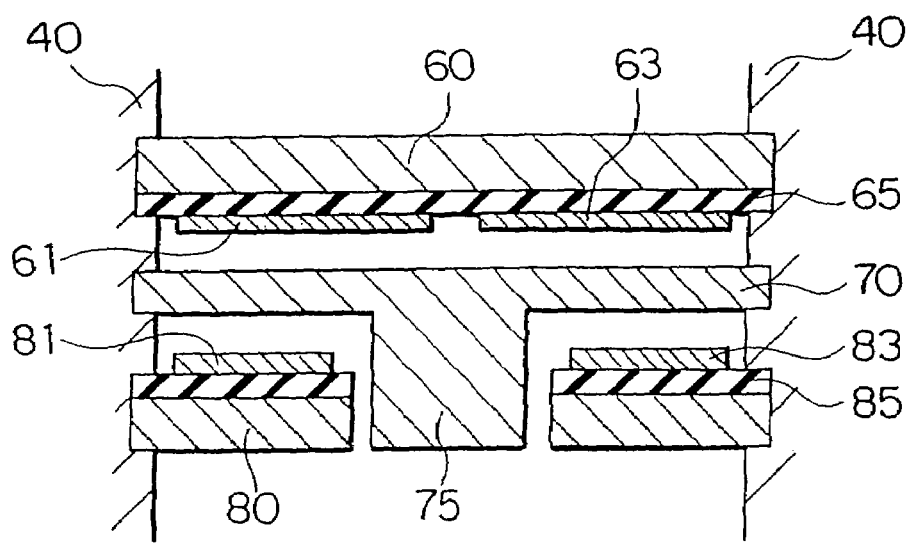
FIG. 19 is a side cross sectional view showing the structure of an acceleration detector according to the embodiment having a test function.
Figure 20:
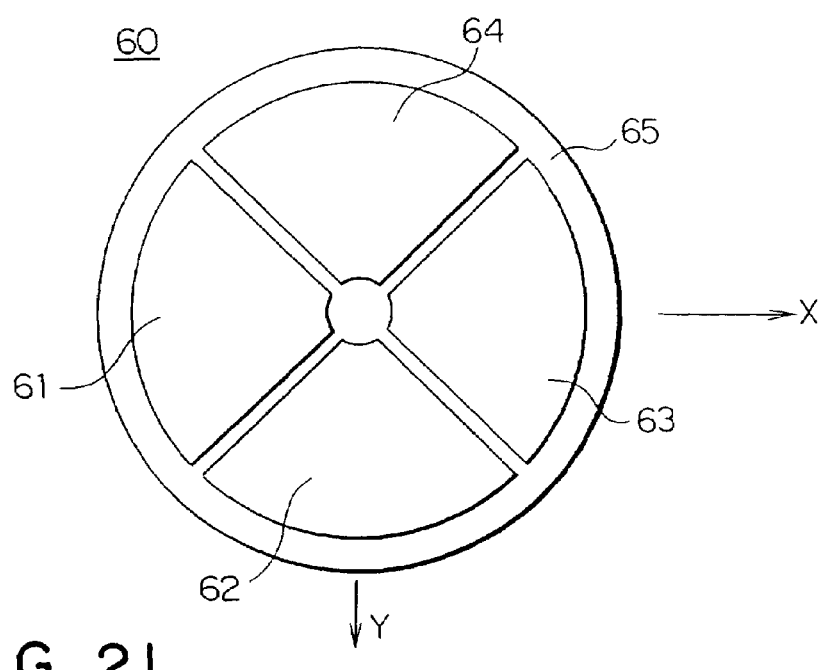
FIG. 20 is a bottom view of the fixed substrate in the detector shown in FIG. 19.
Figure 21:
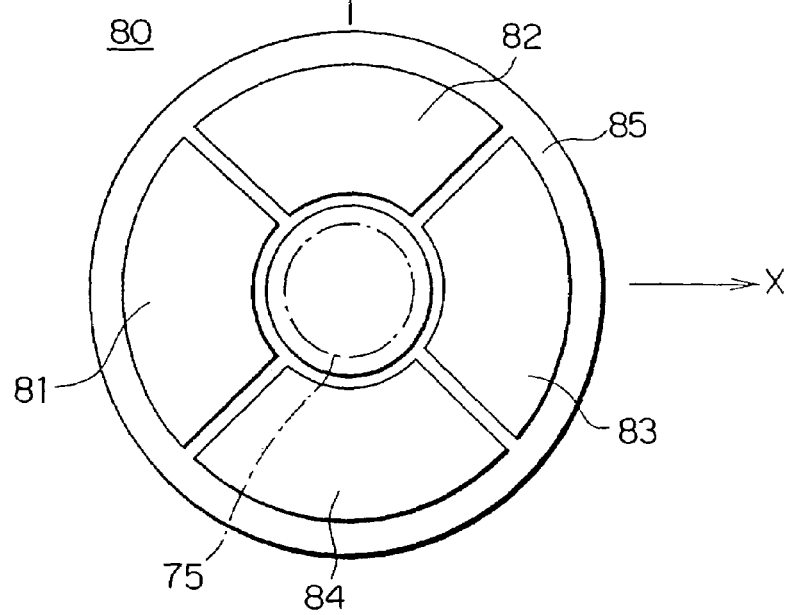
FIG. 21 is a top view of the auxiliary substrate in the detector shown in FIG. 19.

In the embodiment described below, test prior to shipping can be carried out without using such a large test system. FIG. 19 is a side cross sectional view showing the structure of an acceleration detector according to the embodiment having such a test function. This detector comprises, as a main component, a fixed substrate 60, a flexible substrate 70, a working body 75, an auxiliary substrate 80, and a detector casing 40. The bottom view of the fixed substrate 60 is shown in FIG. 20. The cross section cut along the X-axis of the fixed substrate 60 of FIG. 20 is shown in FIG. 19. The fixed substrate 60 is a disk shaped metal substrate, and the periphery thereof is fixed to the detector casing 40. On the lower surface thereof, four quadrant disk shaped fixed electrodes 61 to 64 are formed through an insulating layer 65 such as glass, etc. The flexible substrate 70 is a metal disk having flexibility and its periphery is also fixed onto the detector casing 40. On the lower surface of the flexible substrate 70, a columnar working body 75 is coaxially connected. The upper surface of the flexible substrate 70 constitutes a single displacement electrode opposite to the fixed electrodes 61 to 64. The feature of this embodiment resides in that an auxiliary substrate 80 is further provided. The top view of the auxiliary substrate 80 is shown in FIG. 21. The cross section cut along the X-axis of the auxiliary substrate 80 of FIG. 21 is shown in FIG. 19. The auxiliary substrate 80 is, as shown, a disk shaped metal substrate having a circular through hole formed at the central portion thereof, and its periphery is fixed onto the detector casing 40. As indicated by single dotted lines in FIG. 21, the working body 75 is inserted through the through hole at the central portion thereof. On the upper surface of the auxiliary substrate 80, four auxiliary electrodes 81 to 84 are formed through an insulating layer 85 such as glass. In this example, the lower surface of the flexible substrate 70 constitutes a single auxiliary electrode opposite to the auxiliary electrodes 81 to 84. As stated above, the flexible substrate 70 is a metal mass integrally formed with the working body 75. The upper surface thereof serves as a single displacement electrode opposite to the fixed electrodes 61 to 64, and the lower surface thereof serves as a single auxiliary electrode opposite to the auxiliary electrodes 81 to 84.

In accordance with such a configuration, as previously described, by the fixed electrodes 61 to 64 and the displacement electrode opposite thereto (the upper surface of the flexible substrate 70), four sets of capacitance elements can be formed. Thus, an acceleration applied to the working body 75 can be detected on the basis of changes in these electrostatic capacitance values. Further, by the auxiliary electrodes 81 to 84 and the displacement electrode (the lower surface of the flexible substrate 70), four sets of capacitance elements are formed, thus making it possible to detect an acceleration. The feature of this detector resides in tha. the state equivalent to the state where an acceleration is exerted can be created without actually exerting an acceleration. Namely, when a predetermined voltage is applied across respective electrodes, a coulomb force is exerted therebetween, so the flexible substrate 70 will bend in a predetermined direction. For example, in FIG. 19, when voltages having different polarities are applied to the flexible substrate 70 and the electrode 63, an attractive force based on the coulomb force is exerted therebetween. Further, when voltages having different polarities are applied to the flexible substrate 70 and the electrode 81, an attractive force based on the coulomb force is also exerted therebetween. When such an attractive force is exerted, even if any force is not actually exerted on the working body 75, the flexible substrate 70 will be bent in the same manner as in the case where a force. Fx in the X-axis direction as shown in FIG. 4 is exerted. Further, when voltages having the same polarity are applied to the flexible substrate 70 and the electrodes 81 to 84, a repulsive force based on the coulomb force is exerted therebetween. As a result, even if any force is not actually exerted on the working body 75, the flexible substrate 70 will bend in the same manner as in the case where a force Fz in the Z-axis direction as shown in FIG. 5 is exerted. Thus, by applying voltages having predetermined polarities to respective electrodes, the state equivalent to the state where forces in various directions are exerted can be created. Accordingly, it is possible to test the detector without actually applying an acceleration thereto.

Further, the structure in which the auxiliary substrate 80 shown in FIG. 19 is added also provides the secondary effect that when an excessive acceleration is applied, the flexible substrate 70 can be prevented from being damaged. While the flexible substrate 70 has flexibility, it may be damaged when an excessive force is applied thereto. However, in accordance with the structure shown in FIG. 19, even in the case where an excessive force is applied, since the displacement of the flexible substrate 70 limitatively fall within a predetermined range, an excessive displacement which might be damaged is not produced. Namely, in the case where an excessive acceleration is applied in a lateral direction (in the X-axis or Y-axis direction) in FIG. 19, the side surface of the working body 75 comes into contact with the inner surface of the through hole of the auxiliary substrate 80. As a result, any more displacement is not produced. Further, in the case where an excessive acceleration is applied in upper and lower directions (in the Z-axis direction) in FIG. 19, the upper surface or the lower surface of the bent flexible substrate 70 comes into contact with the fixed electrodes 61 to 64 or the auxiliary electrodes 81 to 84. As a result, any more displacement is not produced.

Figure 22:
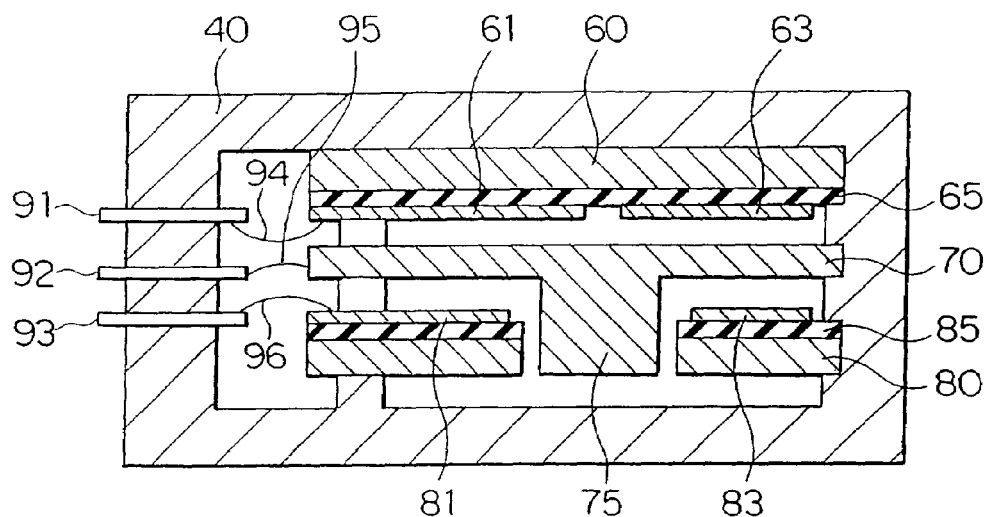
FIG. 22 is a side cross sectional view showing the state where the acceleration detector of the structure shown in FIG. 19 is accommodated into an actual detector casing 40.

FIG. 22 is a side cross sectional view showing the state where the acceleration detector of the structure shown in FIG. 19 is accommodated into an actual detector casing 40. Respective electrodes and external terminals 91 to 93 are connected by way of bonding wires 94 to 96 (Actually, electrically independent electrodes are respectively connected to exclusive external terminals by way of bonding wires, but only main wirings are indicated in the figure). The upper surface of the fixed substrate 60 is connected to the internal upper surface of the detector casing 40, and is firmly held so that the fixed substrate 60 does not bend.

§6 Embodiment Utilizing the Piezo Electric Element

Figure 23A:
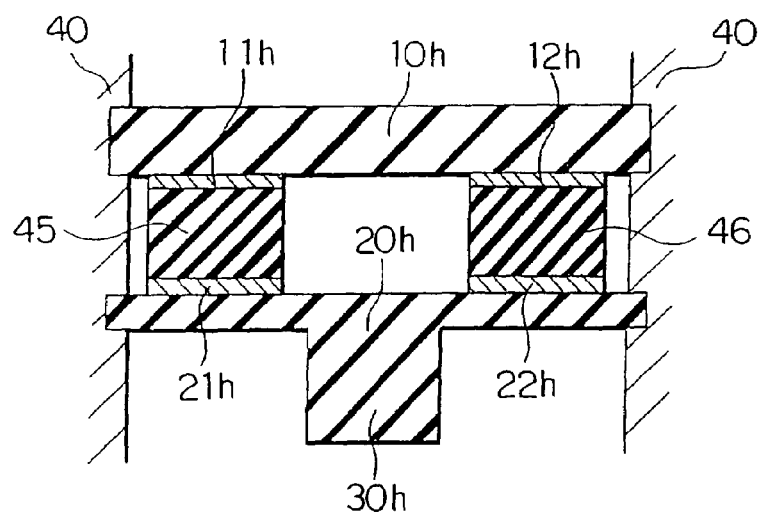
FIGS. 23a and 23b are side cross sectional views showing the structure of the embodiment using piezo electric element.

In the previously described various embodiments, since an external force can be detected as changes in electrostatic capacitance values, a processing circuit for converting the electrostatic capacitance value to a voltage value, etc. is required from a practical point of view. In the embodiment shown in FIG. 23*a*, such a processing circuit becomes unnecessary by making use of the piezo electric element. The basic configuration of the detector of this embodiment is common to those of the previously described various embodiments. Namely, fixed substrate 10*h* and flexible substrate 20*h* are affixed within the detector casing 40 so that they are opposite to each other. In this embodiment, the both substrates are comprised of an insulating body, but may be comprised of metal or semiconductor. When an external force is exerted on the working body 30$h$, the flexible substrate 20$h$ will bend. As a result, the distances between the fixed electrodes 11$h$ and 12$h$ and the displacement electrodes 21$h$ and 22$h$ opposite thereto vary. In the previously described embodiment, a change of the distance between both the electrodes is detected as a change of the electrostatic capacitance. In contrast, in this embodiment, such a change can be detected as a voltage value. To realize this, piezo electric elements 45 and 46 are formed so that they are put between the fixed electrodes 11$h$ and 12$h$ and the displacement electrodes 21$h$ and 22$h$. Of courses an approach may be employed to form respective electrodes on both the upper and lower surfaces of the piezo electric elements 45 and 46 thereafter to allow them to be put between the fixed substrate 10$h$ and the flexible substrate 20$h$. If the distance between both the electrodes is contracted, a compressive force is exerted on the piezo electric elements 45 and 46. In contrast, if that distance is expanded, a tensile force is exerted on the piezo electric elements 45 and 46. As a result, a voltage corresponding to each force is produced by the piezo electric effect. Since such a voltage can be taken out from both the electrodes as it is, an external force exerted can be eventually outputted directly as a voltage value.

Figure 23B:
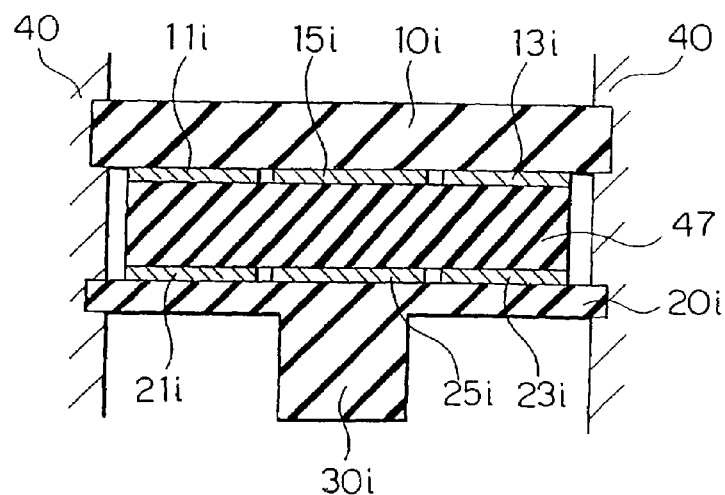

As the piezo electric elements 45 and 46, for example, PZT ceramics (solid solution of lead titanate and lead zirconate) may be used. In use, it is sufficient to mechanically connect this between both the electrodes. Although only the side cross sectional view is shown in FIG. 23$a$, it is enough for detecting a three dimensional acceleration to arrange four sets of piezo electric elements in the same manner as in the electrode arrangement shown in FIG. 3. Alternatively, in the same manner as in the electrode arrangement shown in FIG. 11, eight sets of piezo electric elements (four sets of piezo electric elements for detecting a force in the Z-axis direction of the eight sets thereof can be substantially combined into one set) may be arranged. Further, in order to detect a two dimensional acceleration, two sets of piezo electric elements may be arranged in the same manner as in the electrode arrangement shown in FIG. 18. Also in the case where the detector is accommodated into the actual detector casing 40, configuration substantially similar to that of the embodiment shown in FIG. 22 is provided. In this case, voltage values are directly outputted from external terminals 91 to 93.

The secondary effect of this embodiment shown in FIG. 23$a$ is that the piezo electric elements 45 and 46 have a protective function against the flexible substrate 20$h$. Namely, even in the case where an excessive force is applied, since the flexible substrate 20$h$ only bends by the existence of the piezo electric elements 45 and 46 so that bending does not exceed a predetermined limit, there is no possibility that the flexible substrate 20$h$ may be damaged. In addition, in the same manner as in the embodiment having the previously described test function, pseudo test in which a coulomb force is exerted between both the electrodes can be conducted.

The embodiment shown in FIG. 23$b$ is directed to the example where a single common piezo electric element 47 is put between the fixed substrate 10$i$ and the flexible substrate 20$i$. Five fixed electrodes 11$i$ to 15$i$ and five displacement electrodes 21$i$ to 25$i$ are formed on the upper surface and the lower surface of the common piezo electric element 47 in the same arrangement as in FIG. 14, respectively. In a manner stated above, only a single common piezo electric element may be used.

§7 Other Embodiments Relating to the Detector

Figure 24:
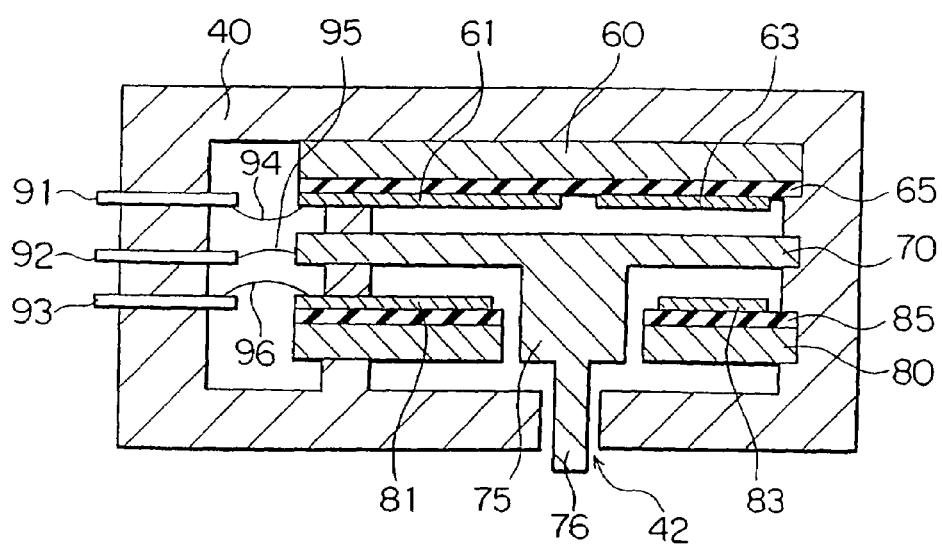
FIG. 24 is a side cross sectional view of a force detector having substantially the same structure as that of the acceleration detector shown in FIG. 22.

While the detector according to this invention has been described in connection with several embodiments, it should be noted that this invention is not limited only to these embodiments, but may be further carried out in various forms. Particularly, in the above described embodiments, there has been shown the example where this invention is applied to an acceleration detector for detecting an acceleration applied to the working body. However, the basic concept of this invention resides in the mechanism for detecting a force exerted on the basis of any physical phenomenon on the working body. Accordingly, it is a matter of course that this invention can be applied to a detector for directly detecting a force in place of the acceleration. FIG. 24 is a side cross sectional view of a force detector having substantially the same structure as that of the acceleration detector shown in FIG. 22. At the lower surface of the detector casing 40, a through hole 42 is formed. A contact 76 extending from a working body 75 is inserted through the through hole 42. Thus, it is possible to directly detect a force exerted on the front end portion of the contact 76. Further, in the acceleration detector shown in FIG. 22, if the working body 75 is formed by magnetic material such as iron, cobalt or nickel, etc., since a force based on magnetism is exerted on the working body 75 when placed in a magnetic field, it is possible to detect magnetism. Thus, this invention can be applied also to the magnetic detector.

As stated above, in accordance with the physical quantity detector according to this invention, since an approach is employed to detect a force, on the basis of changes in electrostatic capacitance values of capacitance elements formed by the displacement electrodes adapted so that they undergo displacement by force/acceleration/magnetism subject to detection and the fixed electrodes fixed in a manner opposite thereto, or on the basis of changes in output from piezo electric elements put between both the electrodes, it is possible to realize, at a low cost, a detector capable of detecting a physical quantity such as force, acceleration, or magnetism, etc. without carrying out temperature compensation.

Further, the physical quantity detector according to this invention can be applied also to a detector using servo system in which feedback control is carried out by applying an voltage between electrodes to control a distance therebetween with coulomb force so that a capacitance of a capacitance element or an output voltage of a piezo electric element becomes constant.

§8 Manufacturing Process I According to this Invention

The configurations of the detector according to this invention have been described in connection with various embodiments. Subsequently, a method suitable for manufacturing these detectors will be described. Here, explanation will be given by taking an example of a method of manufacturing a detector in which the displacement electrode is comprised five localized electrodes. The feature of the manufacturing method described here resides in that a plurality of sensor units are formed on a single substrate thereafter to carry out cutting every respective units (dicing or etching: the example for dicing respective units will be described below). As the manufacturing process I, the process up to dicing every respective units will be first described.

Figure 25:
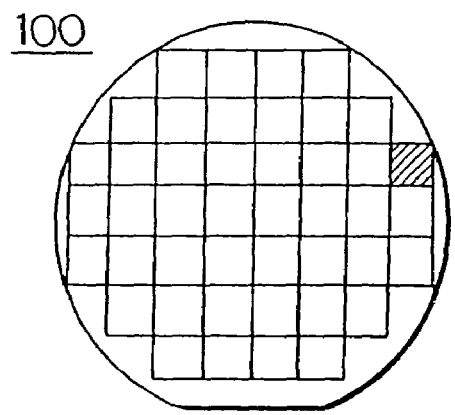
FIG. 25 is a view showing the state where unit regions are defined at the substrate by the manufacturing method according to this invention.
Figure 26:
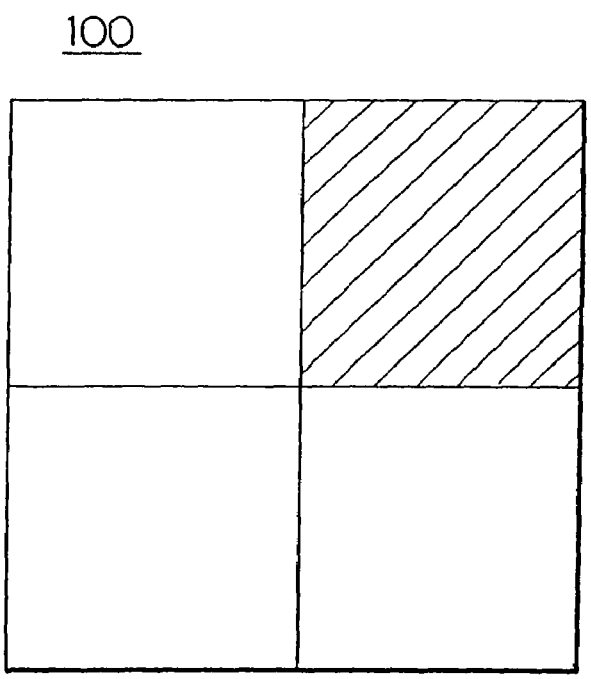
FIG. 26 is a view showing the state where more simple regions are defined for brevity of explanation.

Initially, a plurality of unit regions are defined. A main substrate is separately cut off every unit regions at the subsequent dicing process. Thus, respective unit regions independently function as displacement substrates. FIG. 25 shows a plurality of unit regions formed on the main substrate 100. The portion to which hatching is implemented represents one unit region. Each unit region is square. In the case where wafer such as semiconductor is used as the main substrate 100, a large number of unit regions are generally formed on a disk shaped substrate in a manner stated above. However, for convenience of explanation, the following description will proceed by taking the example where four unit regions (the portion to which hatching is implemented is one unit region) are formed on a square main substrate 100 as shown in FIG. 26.

Figure 14:
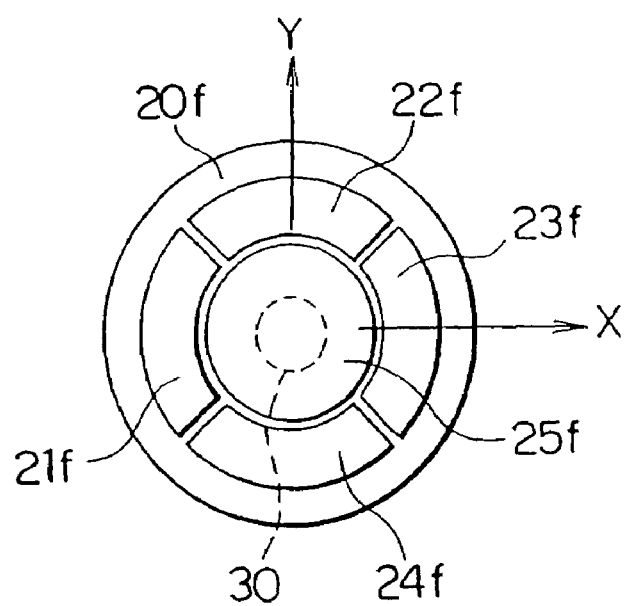
FIG. 14 is a top view showing the flexible substrate in the detector shown in FIG. 13.
Figure 27A:
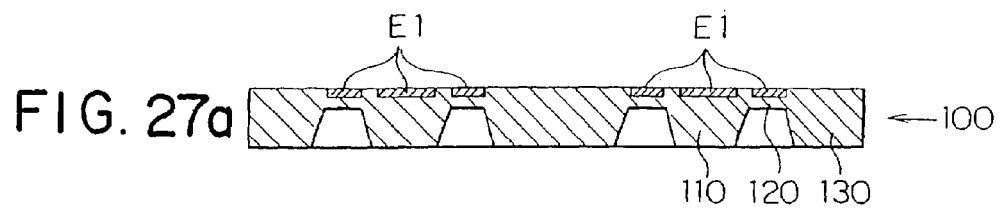
FIGS. 27a to 27d are process diagrams showing the prestate of the method of manufacturing an acceleration sensor center portion according to an embodiment of this invention.

FIGS. 27a to 27d are cross sectional views showing respective process steps of this manufacturing method. These process steps will now be described in detail. Initially, the main substrate 100 is processed as shown in FIG. 28. A single crystal silicon substrate is used as the main substrate 100 in this embodiment, but a substrate of other material such as a glass substrate, etc. may be used. As previously described, the main substrate 100 is square for convenience of explanation, and is divided into four unit regions. Accordingly, exactly the same processing is implemented to respective four unit regions. FIG. 28b is a bottom view of the processed main substrate 100, and FIG. 28a is a side cross sectional view showing the state cut along the cutting line a-a of the main substrate 100. On the upper surface of the main substrate 100, first electrode layers E1 are formed at predetermined positions. These first electrode layers E1 correspond to five displacement electrodes 21 to 25 shown in FIG. 14 (In FIG. 28a, two units of the cross sections of three displacement electrodes thereof are separately shown), and are formed at positions as shown in FIG. 14. In this embodiment, by diffusing impurities into the surface portion of the main substrate 100 comprised of a single crystal silicon substrate, the above mentioned first electrode layers E1 are formed. In addition, the first electrode layers E1 may be formed by using a method of attaching an aluminum layer onto the main substrate 100 through an insulating layer. In short, the first electrode layers E1 may be formed by any method capable of forming a conductive layer. The method based on formation of an impurity diffused layer or formation of an aluminum layer is preferable in that the conventional semiconductor planar process can be utilized as it is. On the other hand, grooves 101 are formed at the lower surface of the main substrate 100 by the method such as etching, etc. to cause the thickness of that portion to be thin, thus allowing the main substrate 100 to have flexibility. In this embodiment, each groove 101 is circular as shown in FIG. 28b. The inside portion of the groove 101 serves as a working portion 110, the outside portion thereof serves as a fixed portion 130, and the groove portion serves as a flexible portion 120. Electrode layers corresponding to displacement electrodes 21f to 24f shown in FIG. 14 of the first electrode layers E1 are just formed on the flexible portion 120 above the grooves, and an electrode layer corresponding to the displacement electrode 25f is formed on the working portion 110 surrounded by each groove. FIG. 27a shows the state where processing of the main substrate 100 is completed.

Figure 27B:
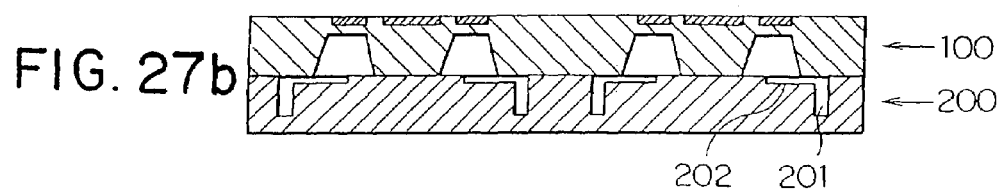

Subsequently, an auxiliary substrate 200 as shown in FIGS. 29a and 29b is prepared. Since a portion of the auxiliary substrate 200 and the remaining portion thereof constitute a weight body and a pedestal, respectively, material suitable for the weight body and the pedestal should be used. Further, since the auxiliary substrate 200 is connected or bonded to the main substrate 100, it is preferable to use a material having substantially the same coefficient of thermal expansion as that of the main substrate 100. For example, it is preferable to use silicon substrate which is the same as the main substrate 100, or glass substrate. FIG. 29b is a top view of the processed auxiliary substrate 200 and FIG. 29a is a side cross sectional view showing the state where the auxiliary substrate 200 is cut along the cutting line a-a. In this way, grooves 201 and 202 are longitudinally and breadthly formed on the upper surface of the auxiliary substrate 200. The groove 201 is a deep groove having a width L1, and the groove 202 is a shallow groove having a width L2. The groove 201 serves to allow the substrate to be easily subjected to dicing at the subsequent process step. In short, the groove 201 is only required to be formed at a position such that portions 210 (four portions in the figure) corresponding to the working portion 110 of the main substrate 100 and portions 220 (other portions) corresponding to the fixed portion 130 can be separated. In other words, the auxiliary substrate 200 is caused to overlap with the main substrate 100, and is connected or bonded thereon. In this case, it is only required that when solely the auxiliary substrate 200 is cut along the groove 201, the auxiliary substrate 200 can be separated into the weight body (portions 210) and the pedestal (portions 220). Further, the groove 202 serves to provide degree of freedom relating to displacement in an upper direction of the weight body which has been cut. After such an auxiliary substrate 200 is prepared, this auxiliary substrate is connected or bonded to the main substrate 100 as shown in FIG. 27b. This bonding may be carried out by adhesive agent. However, in order to carry out secure bonding, it is preferable to use the anodic bonding or the direct bonding capable of directly bonding materials each other. Namely, in case of the anodic bonding, a voltage is applied across the both members to elevate the temperature of both the members to bond them while applying a pressure. In case of the direct bonding, it is not needed to apply a voltage.

Figure 27C:
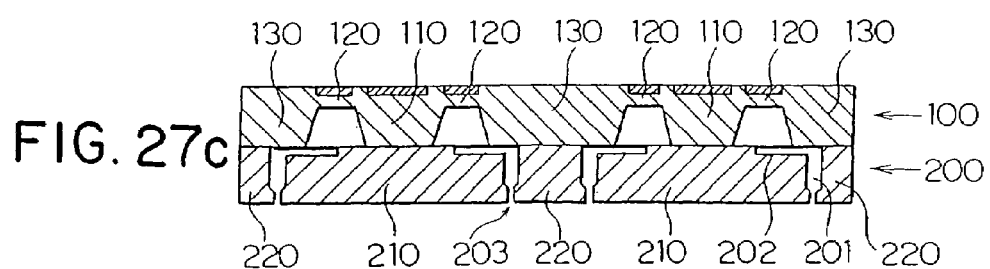

Subsequently, as shown in FIG. 27c, the auxiliary substrate 200 is cut along the groove 201 by means of a dicing blade. Each cutting path 203 is formed on the opposite side (lower part in the figure) to the groove 201. Thus, the portions 210 (serving as the weight body) and the portions 220 (serving as the pedestal) will be completely cut off. As shown in FIG. 29b, the portions 210 (weight body) are positioned at four places. Thus, there results the state where such portions are bonded only to the working portion 110 shown in FIG. 28b. Further, there results the state where the remaining portions 220 (pedestal) are bonded only to the fixed portion 130 shown in FIG. 28b. It is to be noted that since the flexible portion 120 is in the state floating from the auxiliary substrate 200, it is not bonded to any portion. As stated above, by dicing the auxiliary substrate 200, the weight body 210 and the pedestal 220 can be formed at the same time. Here, the pedestal 220 not only performs the function as the pedestal supporting the fixed portion 130, but also performs the control member for conducting a control so that the displacement in a lateral direction of the weight body 210 does not exceed an allowable range. This allowable range will be determined by the width of the cutting path 203 (In the case where the width of the groove 201 is smaller than the width of the cutting path 203, the allowable range is determined by the width of the groove 201). It is to be noted that the dicing process carried out here is the dicing process for only the auxiliary substrate 200. Accordingly, the main substrate 100 is still in the state of a single substrate.

Figure 27D:
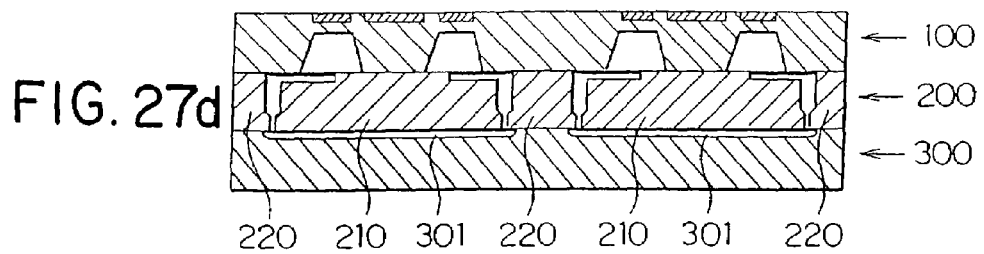

Subsequently, a control substrate 300 as shown in FIGS. 30a and 30b is prepared. This control substrate 300 serves to control the weight body 210 so that displacement in a lower direction thereof falls within an allowable range. As the material of the control substrate 300, silicon substrate or glass substrate may be used in the same manner as in the auxiliary substrate 200. Exactly the same processing is implemented to the upper surface of the control substrate 300 in connection with respective four units. FIG. 30b is a top view of the processed control substrate 300, and FIG. 30a is a side cross sectional view showing the state where the control substrate 300 is cut along the cutting line a-a. On the side of the upper surface thereof, square grooves 301 are formed at four portions. These grooves 301 serve to control the degree of freedom in a lower direction of displacement of the weight body 210 wherein the degree of freedom is determined by the depth of the groove 301. This control substrate 300 is connected or bonded to the auxiliary substrate 200 as shown in FIG. 27d. Also in this bonding, it is preferable to use the anodic bonding or the direct bonding.

Figure 32A:
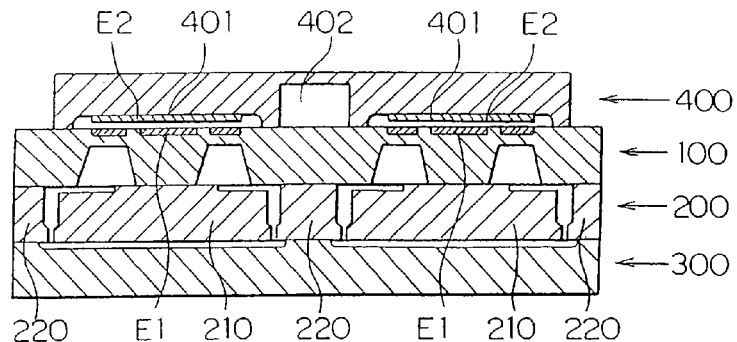
FIGS. 32a to 32c are process diagrams showing the poststage of a method of manufacturing an acceleration sensor center portion 500 according to an embodiment of this invention.

Subsequently, a supplementary substrate 400 as shown in FIGS. 31a and 31b is prepared. This supplementary substrate 400 serves to support the second electrode layers E2. As the material of the supplementary substrate, silicon substrate or glass substrate may be used in the same manner as in the main substrate 100. Exactly the same processing is implemented to the lower surface of the supplementary substrate 400 in connection with respective four unit regions. FIG. 31b is a bottom view of the processed supplementary substrate 400, and FIG. 31a is a side cross sectional view showing the state where the processed supplementary substrate 400 is cut along the cutting line a-a. On the lower surface thereof, square grooves 401 are formed at four portions, and second electrode layers E2 are formed on the bottom surfaces of the grooves 401, respectively. These second electrode layers E2 correspond to the fixed electrodes 11 shown in FIG. 13, and are formed at positions as shown in FIG. 13, i.e., at positions opposite to the displacement electrodes 21 to 25. In this embodiment, grooves 401 are formed by the process such as etching, etc. on the surface of the supplementary substrate 400 comprised of a single silicon substrate thereafter to form second electrode layers E2 by the process for attaching an aluminum layer on the bottom surfaces of these grooves 401 through insulating layers. As a matter of course, second electrode layers E2 may be formed by the impurity diffusion process in the same manner as in the first electrode layer. E1. In short, second electrode layers E2 may be formed by any process capable of forming a layer having conductive property. The process based on formation of the impurity diffused layer or formation of the aluminum layer is preferable in that the technology of the conventional semiconductor planar process can be utilized as it is. The formation of the grooves 401 and/or the formation of the second electrode layers E2 can be carried out with an extremely high accuracy by making use of the micro machining technology used in the semiconductor process. Another feature of the supplementary substrate 400 resides in that the width in a lateral direction is slightly smaller than those of other substrates, and that a longitudinally elongated groove 402 is formed at the center of the supplementary substrate 400. This is the device for facilitating the wire bonding to be carried out as described later. This supplementary substrate 400 is connected or bonded to the main substrate 100 as shown in FIG. 32a. Also in this bonding, it is preferable to use the Anodic bonding or the Direct bonding. Thus, the first and second electrode layers E1 and E2 are opposite to each other in upper and lower directions of the figure. It is preferable that the distance between both electrodes is as narrow as possible from viewpoints of increasing the electrostatic capacitance and carrying out high sensitivity measurement. By making use of the previously described micro machining technology, the distance between both the electrodes can be held down to about several μm.

Figure 32B:
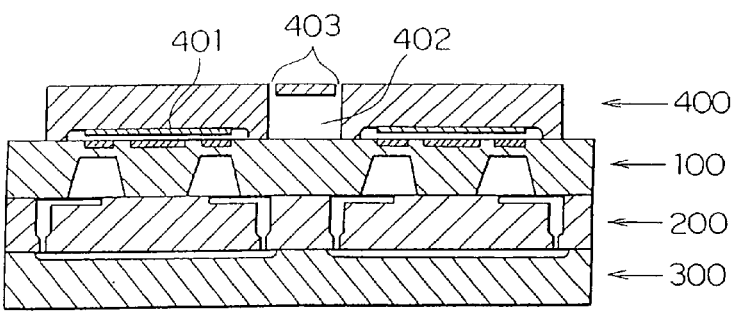
Figure 32C:
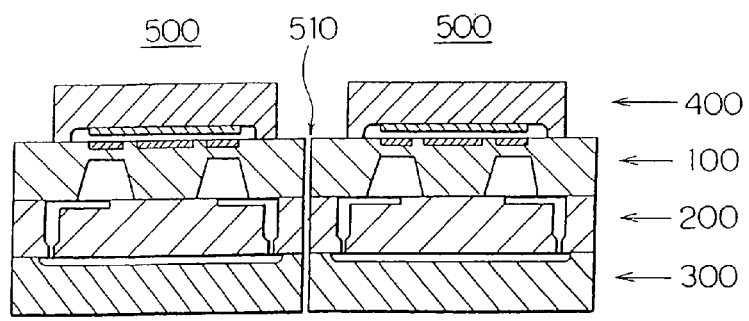

Thereafter, as shown in FIG. 32b, the upper parts of the groove 402 is cut off by cutting paths 403. Further, when respective unit regions are cut along a cutting path 510 as shown in FIG. 32c, four unit regions shown in FIG. 26 are separated, respectively. Thus, each sensor center portion 500 is completed. The perspective of the sensor center portion 500 thus completed is shown in FIG. 33. The reason why the width in a lateral direction of the supplementary substrate 400 is formed short and the longitudinally elongated groove 402 is formed is to allow bonding pads 501 to be exposed as shown in FIG. 33.

§9 Manufacturing Process II According to this Invention

Subsequently, the process steps after respective substrates have been subjected to dicing will be described. If the sensor center portion 500 as shown in FIG. 33 is provided, this sensor center portion is accommodated into a package 600 as shown in the side cross sectional view of FIG. 34. Namely, this is accomplished by allowing the bottom portion of the sensor center portion 500 to adhere on the internal portion of the package 600. Mounting leads 610 are attached to the package 600, and bonding pads 501 and the inside ends of the leads 610 are subjected to bonding by bonding wires 620. Thereafter, when a cover 630 is fitted over the package 600 and is sealed, an acceleration sensor is completed.

As stated above, as compared to the manufacturing process every substrate (the previously described manufacturing process I), the manufacturing process every respective units after dicing (the above described manufacturing process II) is very simple. Namely, in accordance with this invention, most of manufacturing process steps can be carried out every substrate. Thus, an efficient manufacturing suitable for mass production can be conducted.

§10 Other Embodiments Relating to the Manufacturing Method

While the manufacturing method according to this invention has been described in connection with the embodiment shown, this invention is not limited to this embodiment, but may be carried out in various forms. An embodiment in another form will now be illustrated.

(1) While the control substrate 300 is connected or bonded in the above described embodiment, the fundamental idea of this invention resides in that the weight body and the pedestal are formed by the auxiliary substrate 200. Accordingly, the process for bonding the control substrate 300 is not necessarily required. For example, if the bottom surface of the weight body 210 is subjected to shaving or similar processing so that the thickness of the weight body 210 is slightly smaller than the thickness of the pedestal 220, the bottom surface of the pedestal 220 may be directly connected or bonded to the bottom surface of the internal portion of the package 600. Since the thickness of the weight body 210 is slightly smaller than the thickness of the pedestal 220, under the state where no acceleration is exerted, the weight body 210 can be maintained in the state floating from the bottom surface of the internal portion of the package 600.

(2) While the method of manufacturing an acceleration sensor has been described in the above described embodiment, exactly the same process can be carried out also in the case of manufacturing a magnetic sensor. It is to be noted that while the working body exerting a force on the working portion was the weight body 210 in the case of the acceleration sensor, the working body must be a magnetic body in the case of the magnetic sensor. Accordingly, magnetic material is required to be used as the material of the auxiliary substrate 200.

(3) In the auxiliary substrate 200 shown in FIG. 29, grooves 201 are formed in advance. These grooves serve to facilitate the work for cutting the auxiliary substrate 200 at the subsequent process, and therefore are not necessarily required. Namely, if the auxiliary substrate 200 can be properly cut at the subsequent process, the grooves 201 are not required.

(4) In the case of cutting the auxiliary substrate 200 to form a weight body 210 and a pedestal 220, the auxiliary substrate 200 is cut by dicing in the above described embodiment. In addition, the auxiliary substrate 200 may be separated by chemical etching. The term cutting in this specification includes separation by etching as well.

(5) In the control substrate 300 shown in FIG. 30, square grooves 301 are formed every respective unit regions. In place of this, there may be used a control substrate 300' having longitudinally elongated grooves 302 formed striding over unit regions as shown in FIGS. 36a and 36b.

(6) In the above described embodiment, as shown in FIG. 33, the electrical connection between the bonding pads 501 and respective electrode layers (not shown in FIG. 33) is carried out by the diffused layers inside the main substrate. However, in the type in which wiring layers 502 such as aluminum, etc. are formed on the substrate to make an electrical connection therebetween, as in the sensor center portion 500' shown in FIG. 35, it is necessary to ensure gaps 503 for the wiring layers 502. In this case, in place of the supplementary substrate 400 shown in FIG. 31, a supplementary substrate 400' having grooves 404 as shown in FIGS. 37a and 37b may be used.

(7) While explanation has been given in the above-described embodiment in connection with the example where the square substrate shown in FIG. 26 is used to manufacture four sets of sensor center portions for convenience of explanation, larger number of sensor center portions can be manufactured by using the disk shaped wafer as shown in FIG. 25 from a practical point of view. As a matter of course, only a set of sensor center portions may be manufactured by a single substrate (wafer).

(8) While the space around the weight body 210 is filled with air in the above-described embodiment, if silicon oil, etc. is sealed into this space, impact or vibration absorbing effect is provided, resulting in improved impact proof and vibration proof.

(9) In order to take out, as a signal, changes in an electrostatic capacitance, it is generally required to provide an oscillation circuit connected to capacitance elements, an amplifier circuit for amplifying an output from the oscillation circuit, and a counter circuit for counting a frequency of an amplified signal, and the like. If the main substrate 100 is constituted with a semiconductor substrate, the above mentioned circuits can be formed on the main substrate 100.

(10) As shown in FIG. 13, in the embodiment which has been described ere, single fixed electrode 11 is formed on the fixed substrate 10 side and five displacement electrodes 21 to 25 are formed on the displacement substrate 20 side. Conversely, there may be employed an arrangement such that five fixed electrodes are formed on the fixed substrate 10 side and a single displacement electrode is formed on the displacement substrate 20 side.

(11) Further, in the above described embodiment, one of opposite electrode layer is formed with a single electrode layer and the other electrode is formed with five electrode layers. In this case, the single electrode layer is used as the common electrode from a viewpoint of the configuration of the detection circuit. On the contrary, both the electrodes may be formed with five electrode layers, respectively. In this case, five sets of completely independent capacitance elements are constituted. Thus, detection processing having higher degree of freedom can be carried out.

(12) While, in the above described embodiment, five displacement electrodes $21f$ to $25f$ are arranged in a form as shown in FIG. 14 to detect acceleration components in three-dimensional directions, an acceleration component in the Z-axis direction can be conducted without using the displacement electrode $25f$. Namely, as shown in FIG. 3, only four displacement electrodes 21 to 24 can be used, thus making it possible to detect acceleration components in three-dimensional directions. However, in the case of carrying out good precision measurement in which interference with other axis components is suppressed, five electrode arrangement as shown in FIG. 13 is ideal. In other words, it is preferable that detection of the component in the Z-axis direction is carried out by the electrode $25f$ arranged at the center thereof and detection of the component in the X-axis or Y-axis direction is carried out by the electrode $21f$ to $24f$ arranged around the electrode $25f$. It can be understood from FIG. 15 that when a force component in the X-axis or Y-axis direction is exerted, displacement of the electrodes $21f$ to $24f$ is more conspicuous than displacement of the electrode $25f$ (since the electrode $25f$ is arranged at the central portion, it can be considered that it undergoes no displacement when viewed as a whole). Accordingly, it is suitable for detection of the component in the X-axis or Y-axis direction to use electrodes $21f$ to $24f$. Further, it can be understood from FIG. 16 that when a force component in the Z-axis direction is exerted, displacement of the electrode $25f$ is more conspicuous than displacement of the electrodes $21f$ to $24f$. Accordingly, it is suitable for detection of the component in the Z-axis direction to use the electrode $25f$.

As stated above, in accordance with the manufacturing method according to this invention, since an approach is employed to form every substrate the working body (weight body or magnetic body) and the pedestal, and to carry out every substrate formation of necessary electrode layers, sensors utilizing changes in an electrostatic capacitance can be efficiently mass produced.

§11 Still Further Several Embodiments

Figure 38:
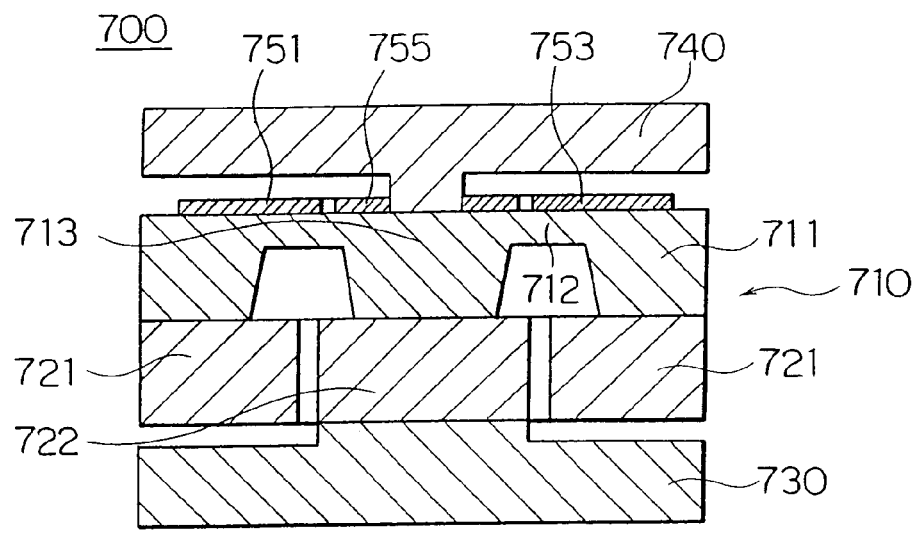
FIG. 38 is a side cross sectional view of an acceleration detector according to a still further embodiment of this invention.

Finally, still further several embodiments will be disclosed. FIG. 38 is a side cross sectional view of an acceleration detector 700 according to a still further embodiment. This acceleration detector has the relationship between the weight body and the pedestal which is opposite to that in the case of the previously described detectors. Namely, the peripheral portion around the flexible substrate 710 serves as a working portion 711, the central portion thereof serves as a fixed portion 713, and the portion therebetween serves as a flexible portion 712. The weight body 721 is in the form of doughnut, and is connected or bonded to the lower surface of the working portion 711. The fixed portion 713 is supported by a pedestal 722, and the pedestal 722 is fixed on a base substrate 730. On the upper surface of the flexible substrate 710, a fixed substrate 740 is connected or bonded. Since the fixed substrate is connected or bonded only at the central portion of the lower surface thereof to the flexible substrate 710 and grooves are formed at the peripheral portion thereof, the flexible substrate 710 and the fixed substrate 740 are maintained with a gap between the upper surface of the flexible substrate 710 and the lower surface of the fixed substrate 740. On the upper surface of the flexible substrate 710, five electrodes 751 to 755 (only three electrodes are illustrated in the figure) are formed through an insulating film. By these five electrodes 751 to 755 and the fixed substrate 740, five sets of capacitance elements are formed. Thus, an acceleration exerted on the weight body 721 can be detected.

In the detectors which have been described, there is employed the structure that the central portion of the flexible substrate serves as the working portion, the peripheral portion serves as the fixed portion, and the pedestal connected or bonded to the fixed portion surrounds the weight body connected or bonded to the working portion. On the contrary, in the detector 700 shown in FIG. 38, there is employed the structure that the peripheral portion of the flexible substrate serves as the working portion, the central portion thereof serves as the fixed portion, and the weight body connected or bonded to the working portion surrounds the pedestal connected or bonded to the fixed portion. The manufacturing methods shown in §8 and §9 can be applied also to the acceleration detector of such a structure.

Figure 39:
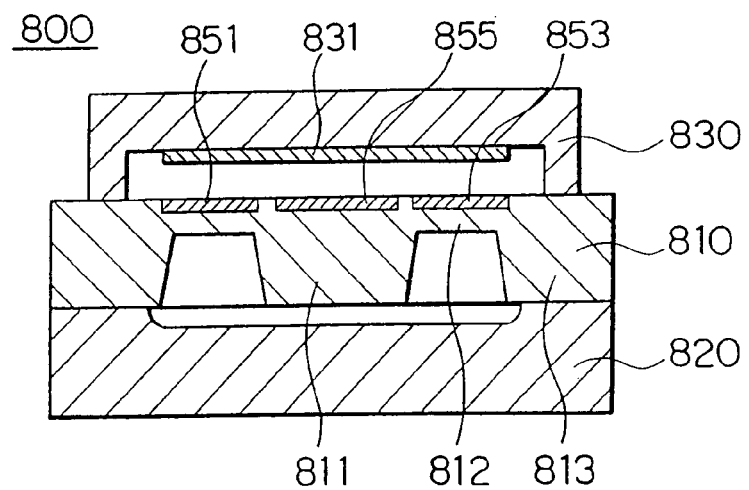
FIG. 39 is a side cross sectional view of the embodiment where the working portion 811 of the flexible substrate 810 is used as the weight body.

FIG. 39 is a side cross sectional view of an acceleration detector 800 of a more simple structure. This acceleration detector is the same as that of the previously described embodiment in that the central portion of the flexible substrate 810 serves as a working portion 811, the peripheral portion thereof serves as a fixed portion 813, and the portion therebetween serves as a flexible portion 812. However, a control substrate 820 is connected or bonded to the lower surface of the flexible substrate 810, and the weight body is not provided. In the same manner as in the previously described embodiment, a fixed substrate 830 is connected or bonded on the upper surface of the flexible substrate 810, and five sets of capacitance elements are formed by five displacement electrodes 851 to 855 (only three electrodes are illustrated in the figure) and a fixed electrode 831 to detect an acceleration exerted on the working portion 811. When the structure shown in FIG. 39 is compared, e.g, to the structure of the sensor center portion 500 shown in FIG. 32c, it can be understood that the structure shown in FIG. 39 is just the structure in which the weight body 210 and the pedestal 220 constituted by the auxiliary substrate 200 are omitted. Since the auxiliary substrate 200 is unnecessary, the structure becomes simple and the manufacturing process is simplified. Namely, this structure is accomplished by connecting or bonding the control substrate shown in FIG. 30a onto the lower surface of the main substrate 100 shown in FIG. 28a, and connecting or bonding the supplementary substrate shown in FIG. 31a onto the upper surface of the main substrate 100. However, since the working portion 811 performs the function as the weight body, the sensitivity is lowered.

Figure 40:
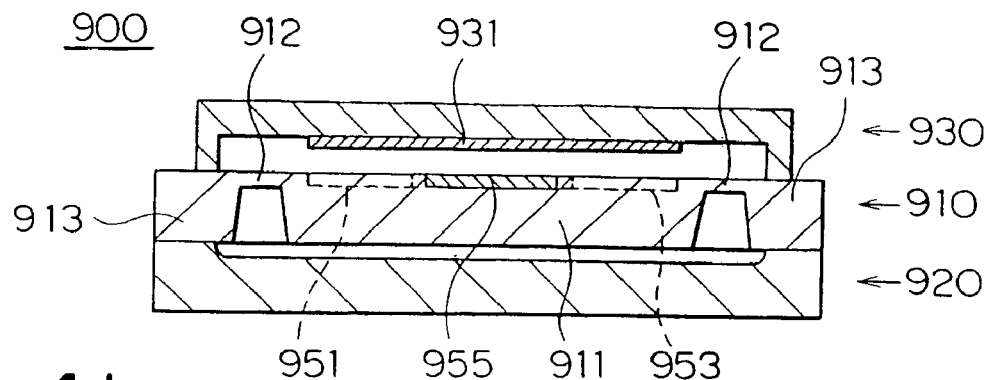
FIG. 40 is a side cross sectional view of the embodiment where the displacement electrode is formed on the working portion 911.
Figure 41:
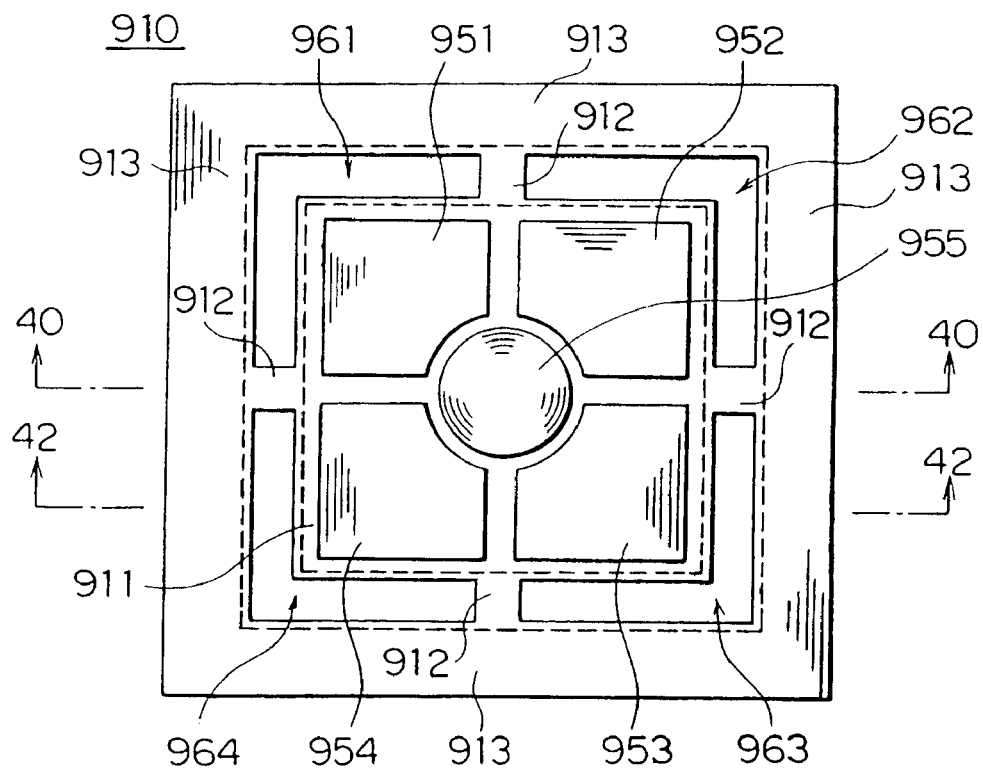
FIG. 41 is a top view of the flexible substrate 910 in the detector 900 shown in FIG. 40.
Figure 42:
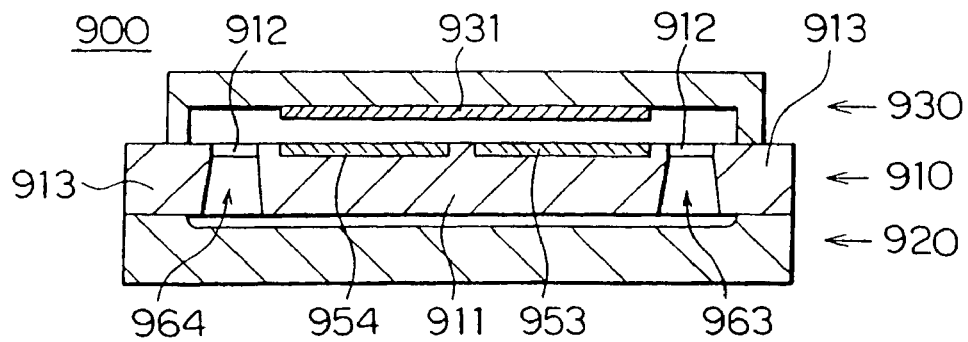
FIG. 42 is a side cross sectional view showing a different cross section of the detector 900 shown in FIG. 40.
Figure 43:
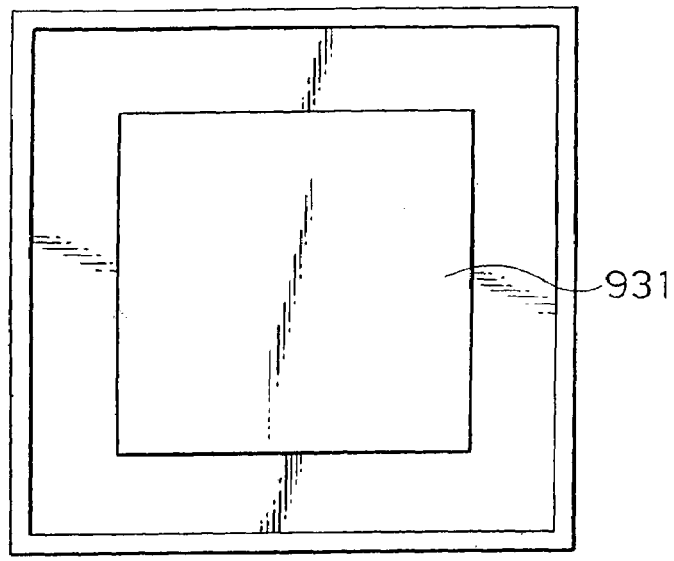
FIG. 43 is a bottom view of the fixed substrate 930 in the detector 900 shown in FIG. 40.

While the structure shown in FIG. 39 can be advantageously realized by allowing three substrates to overlap with each other, the sensitivity is disadvantageously lowered as described above. A detector having a structure capable of compensating this drawback is shown in FIG. 40. In this detector 900, the flexible substrate 910 is comprised of a working portion 911 at the central portion, a fixed portion 913 at the peripheral portion thereof, and a flexible portion 912 provided therebetween. The area occupation ratio of the working portion 911 is high. A control substrate 920 is connected or bonded on the lower surface of the flexible substrate 910, and a fixed substrate 930 is connected or bonded on the upper surface thereof. By displacement electrodes 951 to 955 (only three electrodes are illustrated in FIG. 40) formed on the upper surface of the flexible substrate 910 and the fixed electrode 931 formed on the lower surface of the fixed substrate 930, five sets of capacitance elements are formed to detect an acceleration exerted on the working portion 911. The feature of this embodiment is clearly shown in FIG. 41. FIG. 41 is a top view of the flexible substrate 910 in the detector shown in FIG. 40. The cross section cut along the cutting line 40-40 of the flexible substrate 910 is shown in FIG. 40 and the cross section cut along the cutting lines 42-42 is shown in FIG. 42. The remarkable feature of this flexible substrate 910 resides in that L shaped through holes 961 to 964 are formed as shown. By these L shaped through holes 961 to 964, the flexible substrate 910 is roughly divided into a peripheral frame-shaped fixed portion 913 and an internal square working portion 911. The working portion 911 is in the state where it is connected to the fixed portion 913 through flexible portions 912 at four portions. Eventually, four flexible portions 912 in a beam form support the working portion 911 so as to allow the working portion 911 to hang from four directions. Another feature resides in that displacement electrodes 951 to 955 are all formed on the working portion 911. As shown in FIG. 43, a fixed electrode 931 is formed on the lower surface of the fixed substrate 930 so as to face the displacement electrodes 951 to 955.

Figure 44:
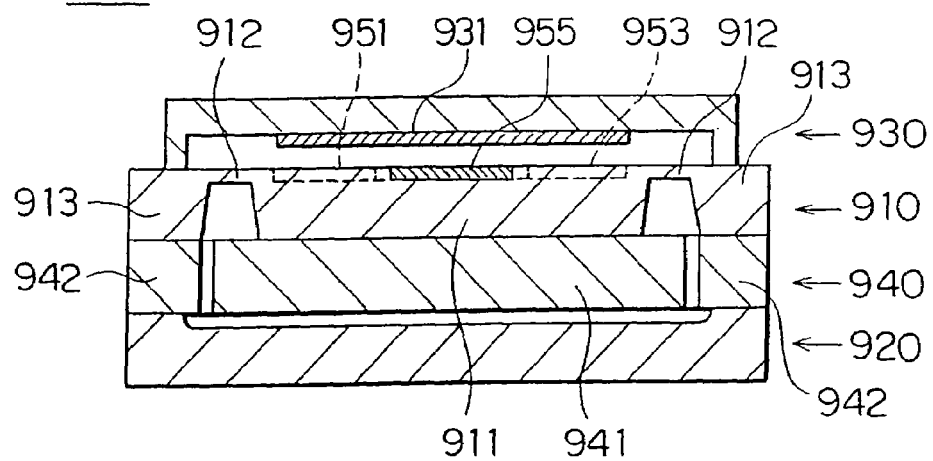
FIG. 44 is a side cross sectional view of the embodiment where the weight body 941 and the pedestal 942 are added to the detector 900 shown in FIG. 40.

This acceleration detector 900 has the following merits. First, since the working portion 911 performs the function as the weight body, the structure is simple. Further, since the working portion 911 can constitute a relatively large block, a sufficient mass is provided, thus making it possible to improve the sensitivity. Furthermore, since five displacement electrodes 951 to 955 are all formed on the upper surface of the working portion 911, displacement can be sufficiently produced by the action of an acceleration. Thus, sensitivity can be improved. Further, since L shaped through holes 961 to 964 are provided so as to support the working portion 911 by the flexible portion 912 in a beam form, the sensitivity is further improved. In addition, the flexible substrate 910 of such a structure can be easily processed by the process such as etching, etc. It is to be noted, in order to further improve the sensitivity, it is sufficient to provide a weight body 941 and a pedestal 942 which can be constituted by cutting a single substrate 940, as shown in FIG. 44, between the flexible substrate 910 and the control substrate 920.

The invention claimed is:

1. An acceleration detector for detecting an acceleration component along an X-axis in an XYZ three-dimensional coordinate system, said detector comprising:
a fixed body and a displacement body, said displacement body being resiliently supported by said fixed body so that said displacement body is displaced with respect to said fixed body in the X-axis direction when acceleration is applied,
a first capacitance element including a first fixed electrode formed on said fixed body and a first displacement electrode formed on said displacement body,
a second capacitance element including a second fixed electrode formed on said fixed body and a second displacement electrode formed on said displacement body, and an output unit for outputting information indicating an acceleration component along the X-axis, wherein an electrode distance of said first capacitance element is decreased and an electrode distance of said second capacitance element is increased when said displacement body is displaced in a positive X-axis direction and the electrode distance of said first capacitance element is increased and the electrode distance of said second capacitance element is decreased when said displacement body is displaced in a negative X-axis direction, wherein said output unit outputs an acceleration component along the X-axis based on a difference between a capacitance value of said first capacitance element and a capacitance value of said second capacitance element, and wherein said fixed body and said displacement body are made of silicon.

2. The acceleration detector as set forth in claim 1, wherein the respective fixed electrodes and the respective displacement electrodes are made of silicon including impurity.

3. An acceleration detector for detecting an acceleration components along an X-axis and a Y-axis in an XYZ three-dimensional coordinate system, said detector comprising:

a fixed body and a displacement body, said displacement body being resiliently supported by said fixed body so that said displacement body is displaced with respect to said fixed body in the X-axis direction and in the Y-axis direction when acceleration is applied, a first capacitance element including a first fixed electrode formed on said fixed body and a first displacement electrode formed on said displacement body, a second capacitance element including a second fixed electrode formed on said fixed body and a second displacement electrode formed on said displacement body, a third capacitance element including a third fixed electrode formed on said fixed body and a third displacement electrode formed on said displacement body, a fourth capacitance element including a fourth fixed electrode formed on said fixed body and a fourth displacement electrode formed on said displacement body, and an output unit for outputting information indicating an acceleration components along the X-axis and the Y-axis, respectively, wherein an electrode distance of said first capacitance element is decreased and an electrode distance of said second capacitance element is increased when said displacement body is displaced in a positive X-axis direction and the electrode distance of said first capacitance element is increased and the electrode distance of said second capacitance element is decreased when said displacement body is displaced in a negative X-axis direction, wherein an electrode distance of said third capacitance element is decreased and an electrode distance of said fourth capacitance element is increased when said displacement body is displaced in a positive Y-axis direction and the electrode distance of said third capacitance element is increased and the electrode distance of said fourth capacitance element is decreased when said displacement body is displaced in a negative Y-axis direction, wherein said output unit outputs an acceleration component along the X-axis based on a difference between a capacitance value of said first capacitance element and a capacitance value of said second capacitance element and outputs an acceleration component along the Y-axis based on a difference between a capacitance value of said third capacitance element and a capacitance value of said fourth capacitance element, and wherein said fixed body and said displacement body are made of silicon.

4. The acceleration detector as set forth in claim 3, wherein the respective fixed electrodes and the respective displacement electrodes are made of silicon including impurity.

5. An acceleration detector for detecting an acceleration components along an X-axis, a Y-axis and a Z-axis in an XYZ three-dimensional coordinate system, said detector comprising:

a fixed body and a displacement body, said displacement body being resiliently supported by said fixed body so that said displacement body is displaced with respect to said fixed body in the X-axis direction, in the Y-axis direction and in the Z-axis direction when acceleration is applied, a first capacitance element including a first fixed electrode formed on said fixed body and a first displacement electrode formed on said displacement body, a second capacitance element including a second fixed electrode formed on said fixed body and a second displacement electrode formed on said displacement body, a third capacitance element including a third fixed electrode formed on said fixed body and a third displacement electrode formed on said displacement body, a fourth capacitance element including a fourth fixed electrode formed on said fixed body and a fourth displacement electrode formed on said displacement body, a fifth capacitance element including a fifth fixed electrode formed on said fixed body and a fifth displacement electrode formed on said displacement body, and an output unit for outputting information indicating an acceleration components along the X-axis, the Y-axis and the Z-axis, respectively, wherein an electrode distance of said first capacitance element is decreased and an electrode distance of said second capacitance element is increased when said displacement body is displaced in a positive X-axis direction and the electrode distance of said first capacitance element is increased and the electrode distance of said second capacitance element is decreased when said displacement body is displaced in a negative X-axis direction, wherein an electrode distance of said third capacitance element is decreased and an electrode distance of said fourth capacitance element is increased when said displacement body is displaced in a positive Y-axis direction and the electrode distance of said third capacitance element is increased and the electrode distance of said fourth capacitance element is decreased when said displacement body is displaced in a negative Y-axis direction, wherein an electrode distance of said fifth capacitance element is decreased when said displacement body is displaced in a positive Z-axis direction and the electrode distance of said fifth capacitance element is increased when said displacement body is displaced in a negative Z-axis direction, and wherein said output unit outputs an acceleration component along the X-axis based on a difference between a capacitance value of said first capacitance element and a capacitance value of said second capacitance element, outputs an acceleration component along the Y-axis based on a difference between a capacitance value of said third capacitance element and a capacitance value of said fourth capacitance element and outputs an acceleration component along the Z-axis based on a capacitance value of said fifth capacitance element.

6. The acceleration detector as set forth in claim 5, wherein the respective fixed electrodes and the respective displacement electrodes are made of silicon including impurity.

7. The acceleration detector as set forth in claim 1, the detector further comprising:
an auxiliary electrode operatively on the fixed body opposite to one of the displacement electrodes for moving the displacement body by a Coulomb force when a voltage is applied between said auxiliary electrode and said one of the displacement electrodes.

8. The acceleration detector as set forth in claim 1, the detector further comprising:
an auxiliary electrode operatively on the displacement body opposite to one of the fixed electrodes for moving the displacement body by a Coulomb force when a voltage is applied between said auxiliary electrode and said one of the fixed electrodes.

9. The acceleration detector as set forth in claim 1, wherein either a plurality of fixed electrodes or a plurality of displacement electrodes are made of a physically single common electrode.

10. The acceleration detector as set forth in claim 3, the detector further comprising:
an auxiliary electrode operatively on the fixed body opposite to one of the displacement electrodes for moving the displacement body by a Coulomb force when a voltage is applied between said auxiliary electrode and said one of the displacement electrodes.

11. The acceleration detector as set forth in claim 5, the detector further comprising:
an auxiliary electrode operatively on the fixed body opposite to one of the displacement electrodes for moving the displacement body by a Coulomb force when a voltage is applied between said auxiliary electrode and said one of the displacement electrodes.

12. The acceleration detector as set forth in claim 3, the detector further comprising:
an auxiliary electrode operatively on the displacement body opposite to one of the fixed electrodes for moving the displacement body by a Coulomb force when a voltage is applied between said auxiliary electrode and said one of the fixed electrodes.

13. The acceleration detector as set forth in claim 5, the detector further comprising:
an auxiliary electrode operatively on the displacement body opposite to one of the fixed electrodes for moving the displacement body by a Coulomb force when a voltage is applied between said auxiliary electrode and said one of the fixed electrodes.

14. The acceleration detector as set forth in claim 3, wherein either a plurality of fixed electrodes or a plurality of displacement electrodes are made of a physically single common electrode.

15. The acceleration detector as set forth in claim 5, wherein either a plurality of fixed electrodes or a plurality of displacement electrodes are made of a physically single common electrode.

* * * * *